(12) United States Patent
Maekawa

(10) Patent No.: US 11,133,393 B2
(45) Date of Patent: Sep. 28, 2021

(54) SEMICONDUCTOR DEVICE AND METHOD OF MANUFACTURING THE SAME

(71) Applicant: RENESAS ELECTRONICS CORPORATION, Tokyo (JP)

(72) Inventor: Nobue Maekawa, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 12 days.

(21) Appl. No.: 16/709,636

(22) Filed: Dec. 10, 2019

(65) Prior Publication Data

US 2020/0212190 A1    Jul. 2, 2020

(30) Foreign Application Priority Data

Dec. 27, 2018  (JP) .............................. JP2018-244512

(51) Int. Cl.
*H01L 29/423* (2006.01)
*H01L 29/06* (2006.01)
*H01L 29/739* (2006.01)

(52) U.S. Cl.
CPC .... *H01L 29/42376* (2013.01); *H01L 29/0696* (2013.01); *H01L 29/4236* (2013.01); *H01L 29/7394* (2013.01)

(58) Field of Classification Search
CPC ........... H01L 29/42376; H01L 29/0696; H01L 29/7394; H01L 29/4236; H01L 29/4238; H01L 29/407; H01L 29/66348; H01L 29/0619; H01L 29/1095; H01L 29/7396; H01L 29/7397
See application file for complete search history.

(56) References Cited

U.S. PATENT DOCUMENTS

| | | | |
|---|---|---|---|
| 8,633,510 B2 | 1/2014 | Matsuura et al. | |
| 2012/0292662 A1* | 11/2012 | Matsuura | H01L 29/66348 257/139 |
| 2012/0313139 A1* | 12/2012 | Matsuura | H01L 29/0615 257/139 |
| 2015/0060937 A1* | 3/2015 | Hikasa | H01L 29/0619 257/139 |
| 2015/0340480 A1* | 11/2015 | Matsuura | H01L 29/7813 257/144 |
| 2016/0336394 A1* | 11/2016 | Hu | H01L 29/407 |
| 2016/0359026 A1* | 12/2016 | Matsuura | H01L 29/7397 |
| 2016/0365433 A1* | 12/2016 | Matsuura | H01L 29/4238 |
| 2017/0018635 A1* | 1/2017 | Tsuyuki | H01L 29/1095 |
| 2017/0033206 A1* | 2/2017 | Matsuura | H01L 29/407 |
| 2017/0125515 A1* | 5/2017 | Shirakawa | H01L 29/0869 |
| 2019/0035920 A1* | 1/2019 | Nagata | H01L 29/1095 |
| 2019/0081161 A1* | 3/2019 | Takahashi | H01L 29/0692 |

(Continued)

FOREIGN PATENT DOCUMENTS

JP    2012-256839 A    12/2012

*Primary Examiner* — Victor A Mandala
(74) *Attorney, Agent, or Firm* — McDermott Will & Emery LLP

(57) ABSTRACT

The semiconductor device includes, in plan view, a gate electrode having a first portion located on a side surface portion where a plurality of emitter regions are formed, and a gate electrode having a second portion located between the plurality of emitter regions. The second portion of the gate electrode has a length shorter than first portion in the direction from the main surface to the back surface of the gate electrode of the semiconductor substrate.

20 Claims, 25 Drawing Sheets

(56) References Cited

U.S. PATENT DOCUMENTS

2019/0181254 A1* 6/2019 Nagata ................ H01L 29/1095
2019/0198660 A1* 6/2019 Kachi ................. H01L 29/0619
2021/0020567 A1* 1/2021 Hu ......................... H01L 24/73

* cited by examiner

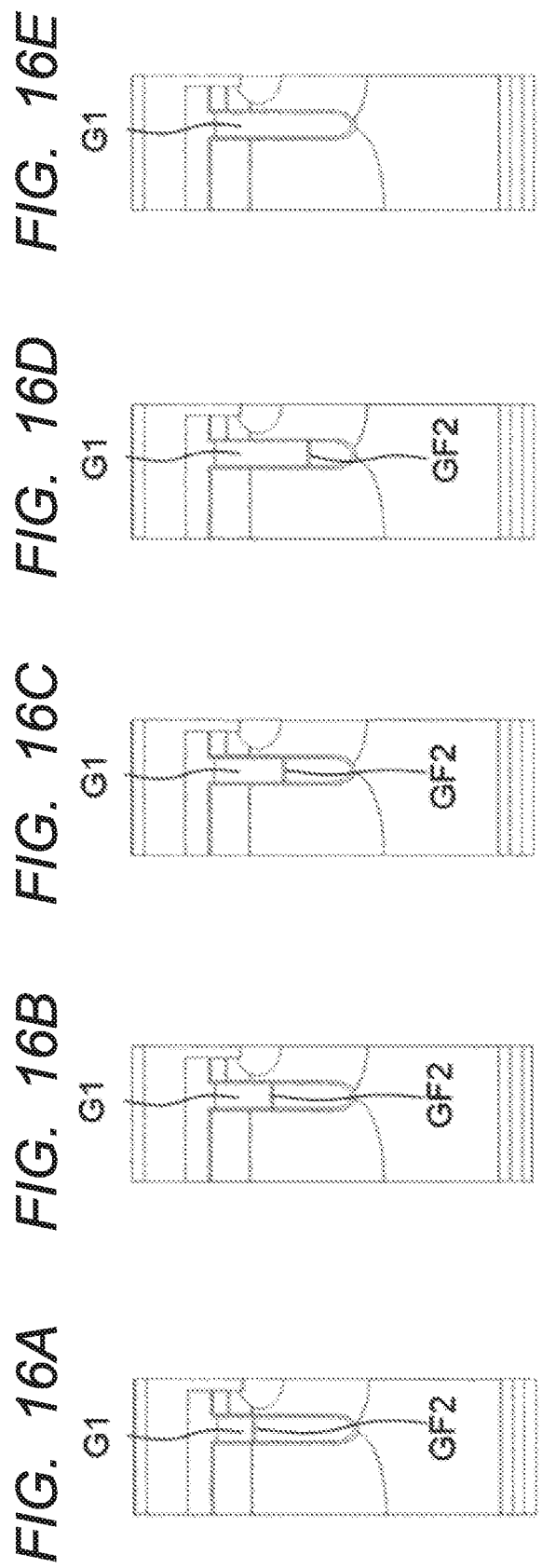
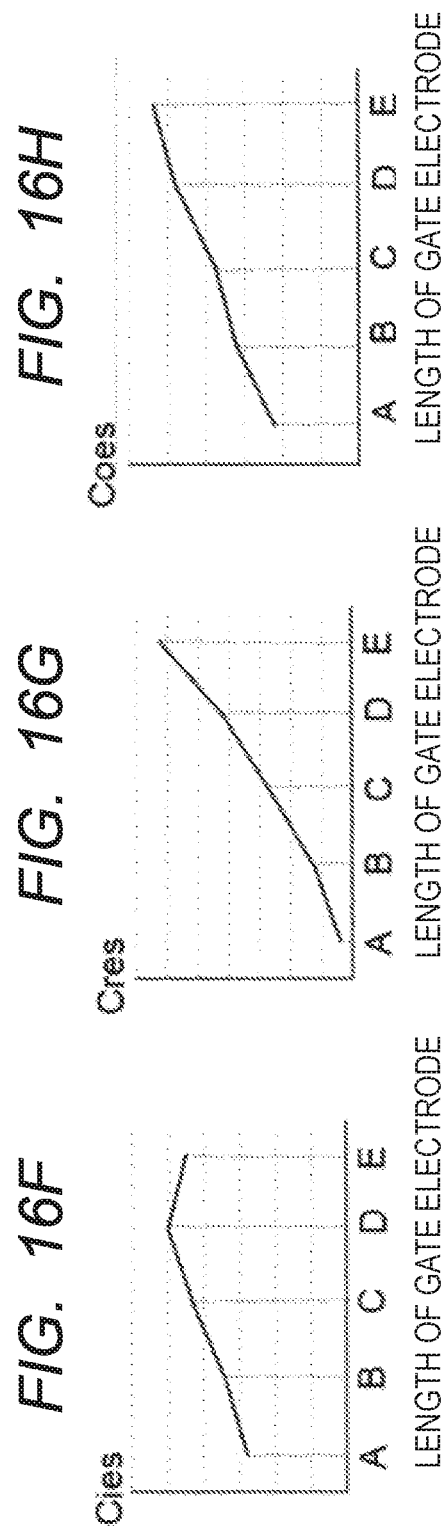
FIG. 16A  FIG. 16B  FIG. 16C  FIG. 16D  FIG. 16E
FIG. 16F  FIG. 16G  FIG. 16H

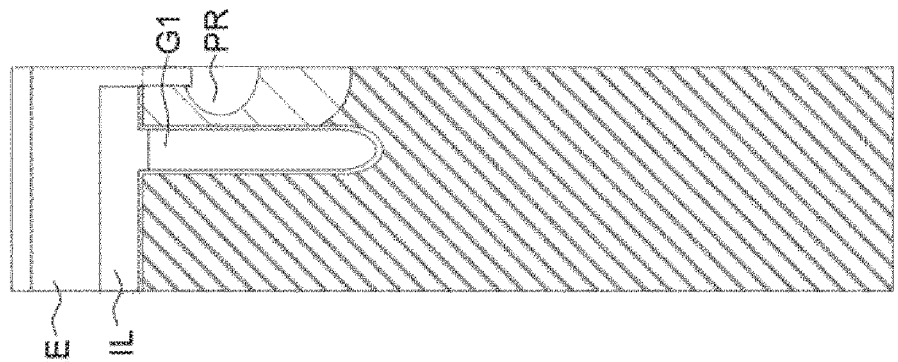
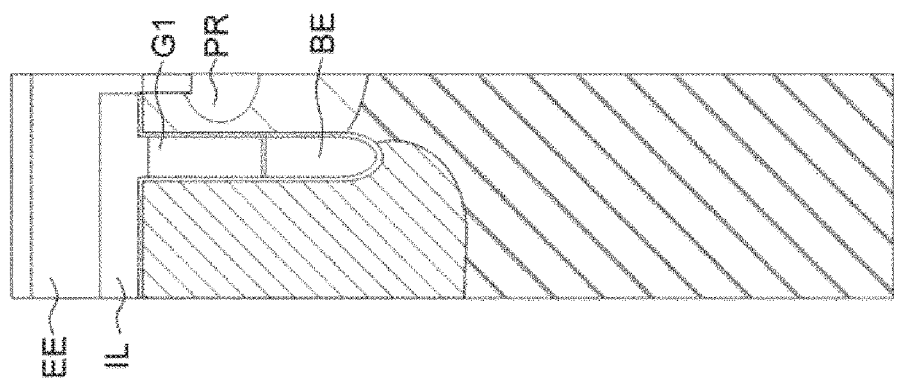
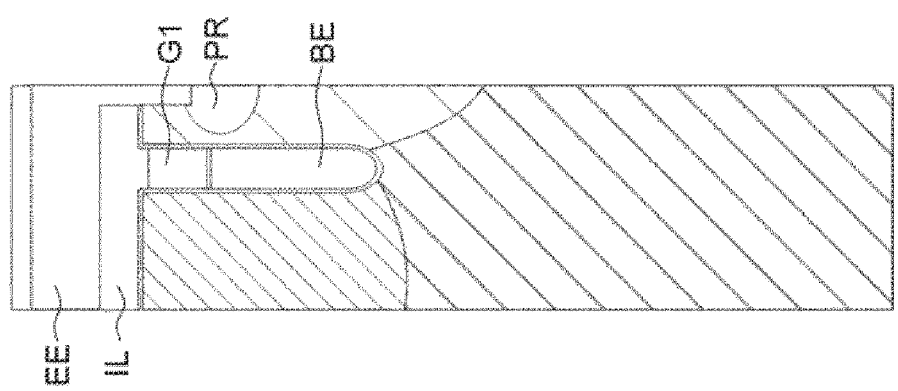

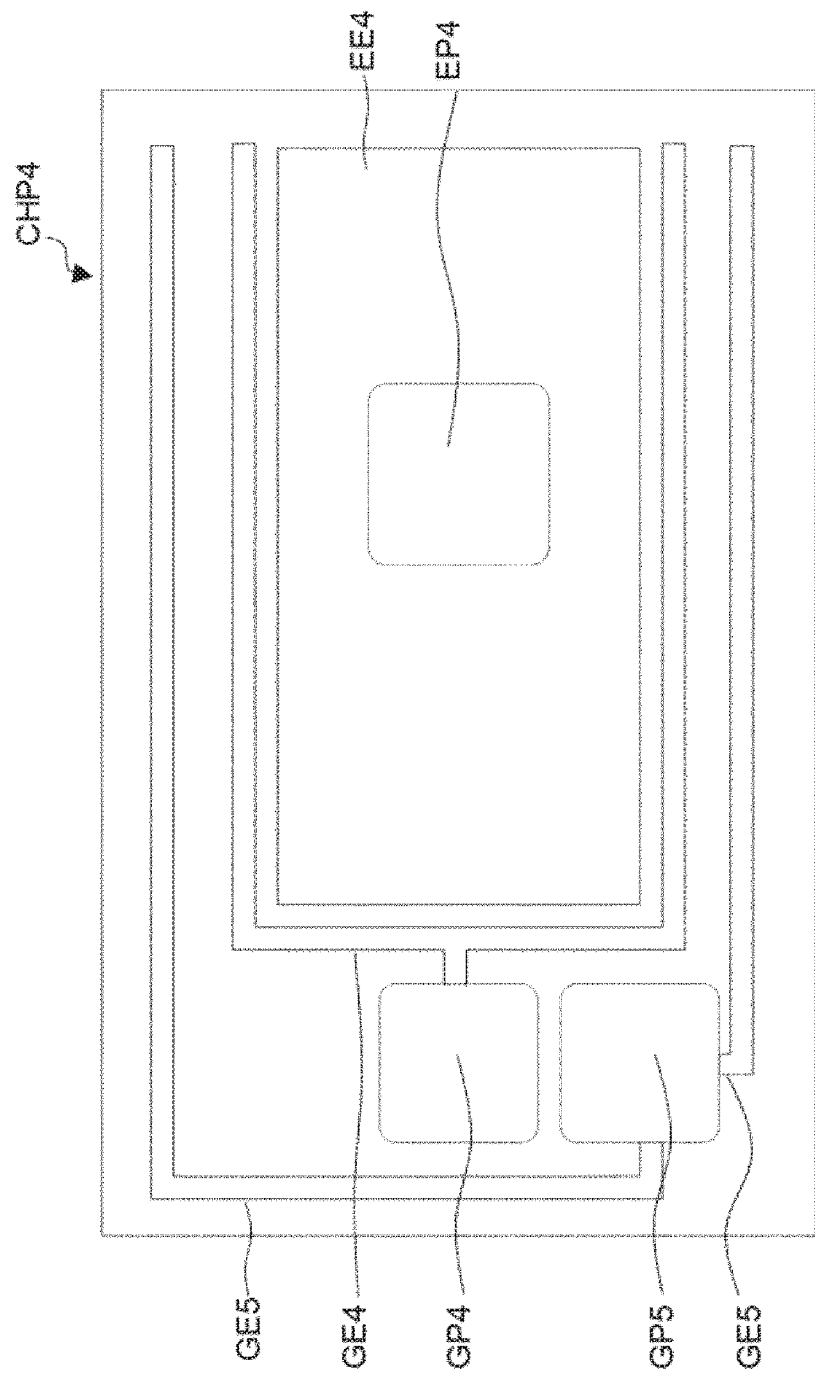

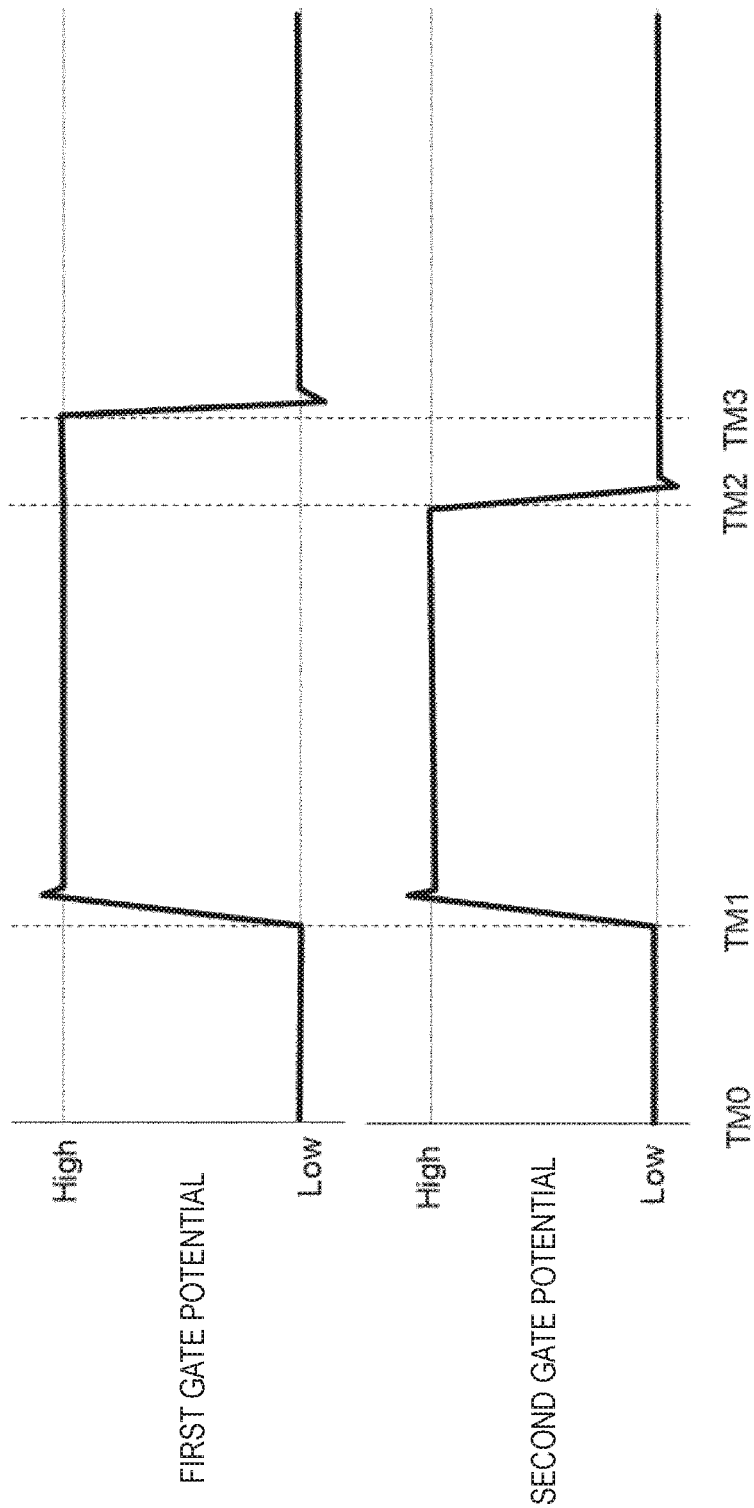

US 11,133,393 B2

SEMICONDUCTOR DEVICE AND METHOD OF MANUFACTURING THE SAME

CROSS-REFERENCE TO RELATED APPLICATIONS

The disclosure of Japanese Patent Application No. 2018-244512 filed on Dec. 27, 2018 including the specification, drawings and abstract is incorporated herein by reference in its entirety.

BACKGROUND

The present invention relates to a semiconductor device and its manufacturing method, and the present invention can be suitably applied to a semiconductor device including, for example, an Insulated Gate Bipolar Transistor (IGBT).

A trench-gate type IGBT is widely used as a IGBT having a low on-resistance, that is, a IGBT having a low forward saturating voltage Vce(sat). As an exemplary structure of a trench gate type IGBT, a GG-type structure IGBT in which two adjacent trenches are connected to a gate potential is known.

Japanese Patent Laying-Open No. 2012-256839 (Patent Document 1) discloses a technique for enhancing an IE (Injection Enhancement) effect by dividing an active cell region connected to emitter electrodes into an active section having an emitter region and an inactive section in an IE type IGBT. The IE effect is an effect of decreasing the on-voltage of the IGBT by increasing the density of charges accumulated in the drift region by making it difficult for holes to be discharged when the IGBT is in the on-state. The IE type IGBT means a IGBT using IE effects.

SUMMARY

In the IGBT having the trench structure, since the gate electrode has a structure insulated by an insulating film such as a silicon oxide film, parasitic capacitance is generated between the emitter potential electrode, the collector potential electrode, and the gate potential electrode. These are called an input capacitance Cies, a feedback capacitance Cres, and an output capacitance Coes, and affect the switching rate and the amount of switching losses. In particular, in a power MOSFET such as an IGBT, since the parasitic capacitance has a large effect on the characteristics of the switching operation, it is required to reduce the parasitic capacitance.

Another problem and a novel feature will be apparent from the description herein and accompanying drawings.

A semiconductor device according to one embodiment includes, in plan view, a gate electrode having a first portion positioned adjacent to a region in which a plurality of emitter regions are formed, and a gate electrode having a second portion positioned adjacent to a region between the plurality of emitter regions in the main surface of the semiconductor substrate. The second portion of the gate electrode has a length shorter than first portion in the direction from the main surface to the back surface of the gate electrode of the semiconductor substrate.

In another embodiment, a semiconductor device includes a first region and a second region, wherein a first gate electrode having a first length and an emitter region are formed in the first region, and a second gate electrode having a second length shorter than the first length is formed in the second region.

In another embodiment, a method of manufacturing a semiconductor device includes forming a first gate electrode having a first length and forming a second gate electrode having a second length less than the first length. A plurality of emitter regions are formed on the side of the first gate electrode.

According to one embodiment, the switching characteristics of the IGBT can be improved.

BRIEF DESCRIPTION OF THE DRAWINGS

FIG. 16A shows the cross-sectional view of Sample A.
FIG. 16B shows the cross-sectional view of Sample B.
FIG. 16C shows the cross-sectional view of Sample C.
FIG. 16D shows the cross-sectional view of Sample D.
FIG. 16E shows the cross-sectional view of Sample E.

FIG. 16F to FIG. 16H show simulation results obtained by calculating the relation between the length of the gate electrode and the parasitic capacitance of the gate electrode.

FIGS. 21A to 21C show the results of simulations in which the relationships between the lengths of the gate electrodes and the hole density distributions of the third embodiment semiconductor chips are calculated.

FIG. 22 is an overall plan view of the fourth embodiment chips.

FIG. 23 is a timing chart showing how to control the gate potentials of the fourth embodiment semiconductor chips.

DETAILED DESCRIPTION

Figure 1:
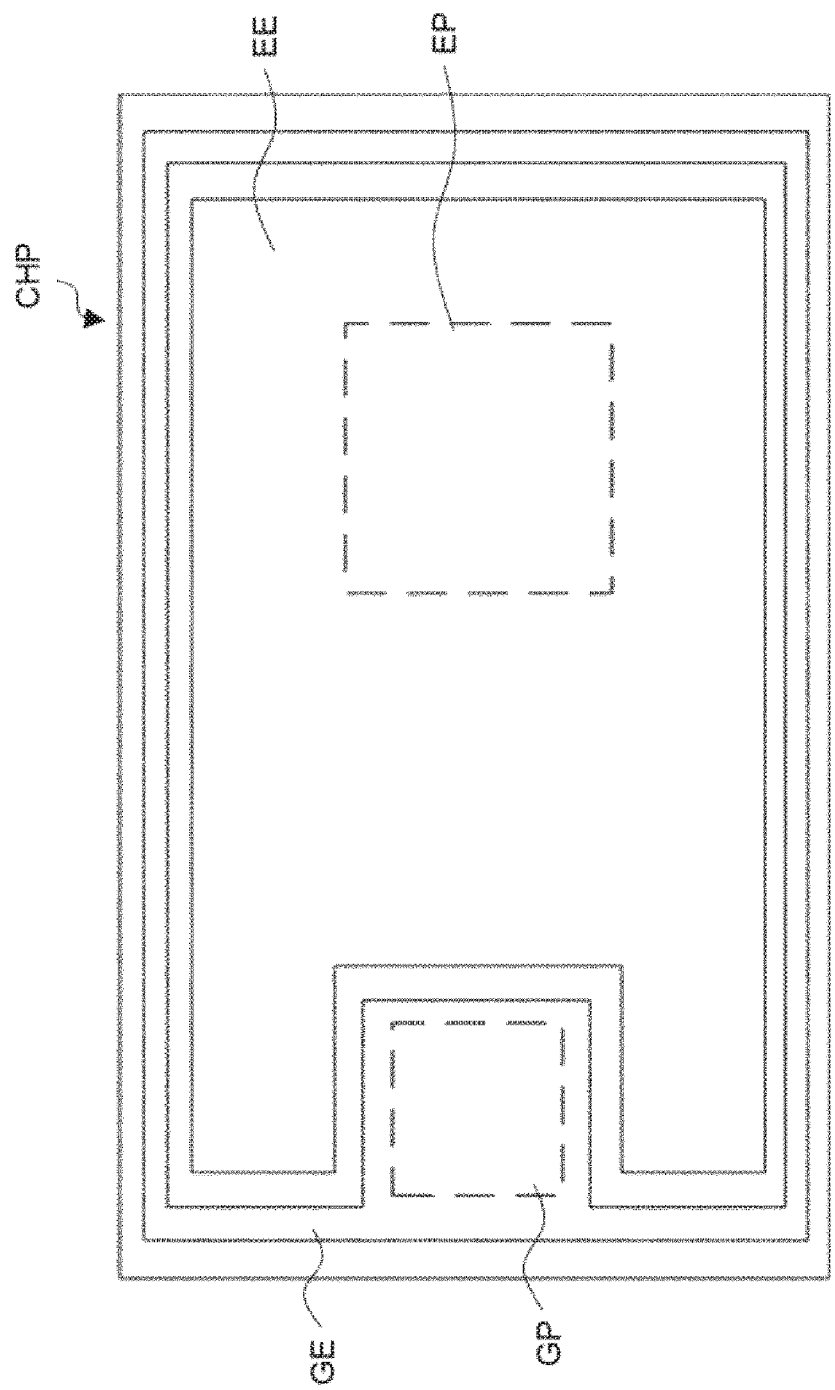
FIG. 1 is an overall plan view of first embodiment chips.

In the following embodiments, when required for convenience, the description will be made by dividing into a plurality of sections or embodiments, but except when specifically stated, they are not independent of each other, and one is related to the modified example, detail, supplementary description, or the like of part or all of the other. In the following embodiments, the number of elements, etc. (including the number of elements, numerical values, quantities, ranges, etc.) is not limited to the specific number, but may be not less than or equal to the specific number, except for cases where the number is specifically indicated and is clearly limited to the specific number in principle. Furthermore, in the following embodiments, the constituent elements (including element steps and the like) are not essential except in the case where they are specifically specified and the case where they are considered to be obviously essential in principle. Similarly, in the following embodiments, when referring to the shapes, positional relationships, and the like of components and the like, it is assumed that the shapes and the like are substantially approximate to or similar to the shapes and the like, except for the case in which they are specifically specified and the case in which they are considered to be obvious in principle, and the like. The same applies to the above numerical values and ranges.

DETAILED DESCRIPTION OF THE INVENTION

In all the drawings for explaining the embodiments, members having the same functions are denoted by the same reference numerals, and repetitive descriptions thereof are omitted. In the following embodiments, descriptions of the same or similar parts will not be repeated in principle except when particularly necessary.

In the drawings used in the embodiments, hatching may be omitted in order to make the drawings easier to see.

In the present specification, the conductivity type of the semiconductor is p-type, which means that the concentration of holes is higher than the concentration of electrons, and the holes are the main charge carriers. A p-type semiconductor means a region of a semiconductor containing an impurity such as boron or gallium. In the present specification, the conductivity type of the semiconductor is n-type, which means that the concentration of electrons is higher than the concentration of holes, and the electrons are the main charge carriers. An n-type semiconductor means, for example, a region of a semiconductor containing an impurity such as phosphorus or arsenic.

In this specification, the switching operation in which the IGBT is switched from the off state to the on state is referred to as "turn-on", and the switching operation in which the IGBT is switched from the on state to the off state is referred to as "turn-off".

First Embodiment

Hereinafter, the semiconductor device of the first embodiment will be described in detail by referring to the drawings. The semiconductor device of the present first embodiment has a semiconductor chip having an IGBT of a new structure, the semiconductor chip having been developed as a basic structure of a GG-type structure.

FIG. 1 is an overall plan view of a semiconductor chip CHP according to the present embodiment. As shown in FIG. 1, most of the semiconductor chip CHP is covered with the emitter potential electrode EE. A gate potential electrode GE is formed on the outer periphery of the emitter potential electrode EE so as to surround the emitter potential electrode EE. A region surrounded by a broken line in the vicinity of the center portion of the emitter potential electrode EE is an emitter pad EP, and a region surrounded by a broken line of the gate potential electrode GE is a gate pad GP. The upper surface of the semiconductor chip CHP is covered with a protective film PIQ (not shown in FIG. 1), but the protective film PIQ is removed from the upper surface of the emitter pad EP and the gate pad GP. External connection terminals such as wire bonding or clips are connected to the emitter pad EP and the gate pad GP, and the semiconductor chip CHP is electrically connected to another chip, a wiring substrate, or the like through the external connection terminals.

Figure 2:
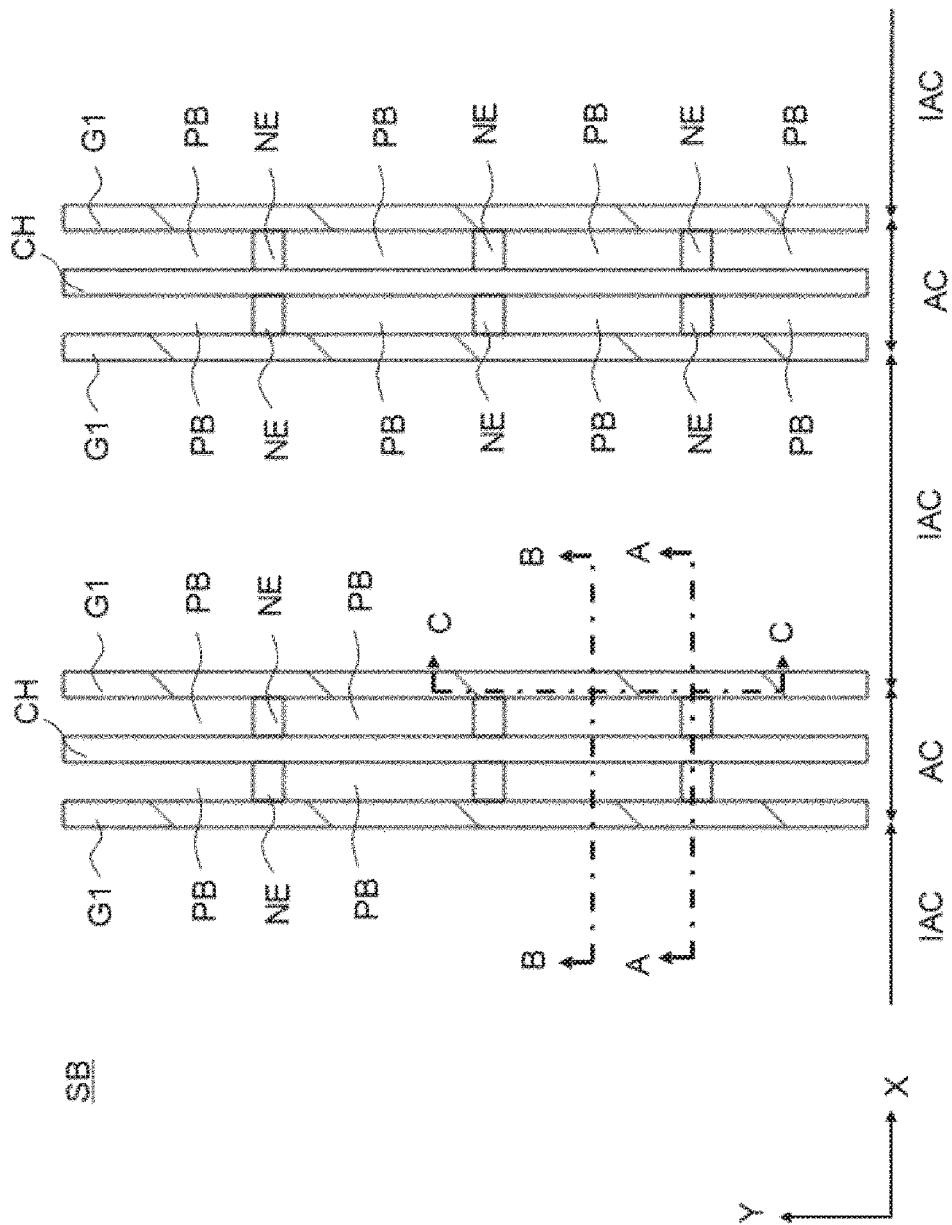
FIG. 2 is a plan view of the main portion of first embodiment chips.

FIG. 2 is a plan view of the main portion of the semiconductor chip CHP, which is a semiconductor device of the semiconductor chip CHP of the present embodiment. The chip CHP comprises a semiconductor substrate SB, and the plane shown in FIG. 2 shows the upper surface of the semiconductor substrate SB.

Although FIG. 2 is a plan view, the gate electrode G1 is hatched to facilitate the viewing of the drawings. In FIG. 2, the protective film PIQ, the emitter-potential electrodes EE, the interlayer insulating film IL, and the gate insulating film GF1 are not shown.

The semiconductor substrate SB of the present embodiment has a plurality of trench-structured gate electrodes G1 electrically connected to the gate potential electrodes GE shown in FIG. 1. The plurality of gate electrodes G1 are formed in stripes along the Y direction, and are arranged adjacent to each other in the X direction crossing the direction in which the gate electrodes G1 extend. Although not shown, the gate electrode G1 is electrically connected at the outer periphery of the semiconductor chip CHP to the gate potential GE illustrated in FIG. 1, and a gate potential is applied during the switching operation of the IGBT.

The semiconductor substrate SB includes an active cell region AC for performing a main operation of the IGBT, and an inactive cell region IAC other than the active cell region AC. The active cell region AC is formed between two gate electrodes G1 adjacent to each other, and has an emitter region NE and a contact hole CH. The inactive cell region IAC is a region formed between the two gate electrodes G1 similarly to the active cell region AC, but is a region different from the active cell region AC and does not have the emitter region NE and the contact hole CH. In the inactive cell region IAC, a floating region PF (not shown in FIG. 2 is formed inside the semiconductor substrate SB.

A base region PB, which is a p-type impurity region, is formed on the surface of the semiconductor substrate SB. The base region PB is a region into which an impurity such as boron or gallium is implanted, and the base region PB can have an impurity density of, for example, about $6\times10^{16}$ of Atoms/cm3. The base region PB is formed at a position deeper than a contact hole CH described later and shallower than the body region. In the active cell region AC, a plurality of n-type emitter regions NE are formed on the surface of the base region PB. The emitter region NE is formed so as to be in contact with a side surface of a trench in which the gate electrode G1 is formed. Further, the emitter regions NE are spaced apart from each other at predetermined intervals in the Y direction. In other words, the plurality of emitter regions NE are formed so as to be separated from each other in the Y direction by the base region PB.

In the active cell area AC, contact holes CH are formed in the surfaces of the semiconductor substrate SB. Although not shown, the emitter potential electrode EE is buried in the contact hole CH, and electrons are supplied from the emitter potential electrode EE to the semiconductor substrate SB.

Figure 3:
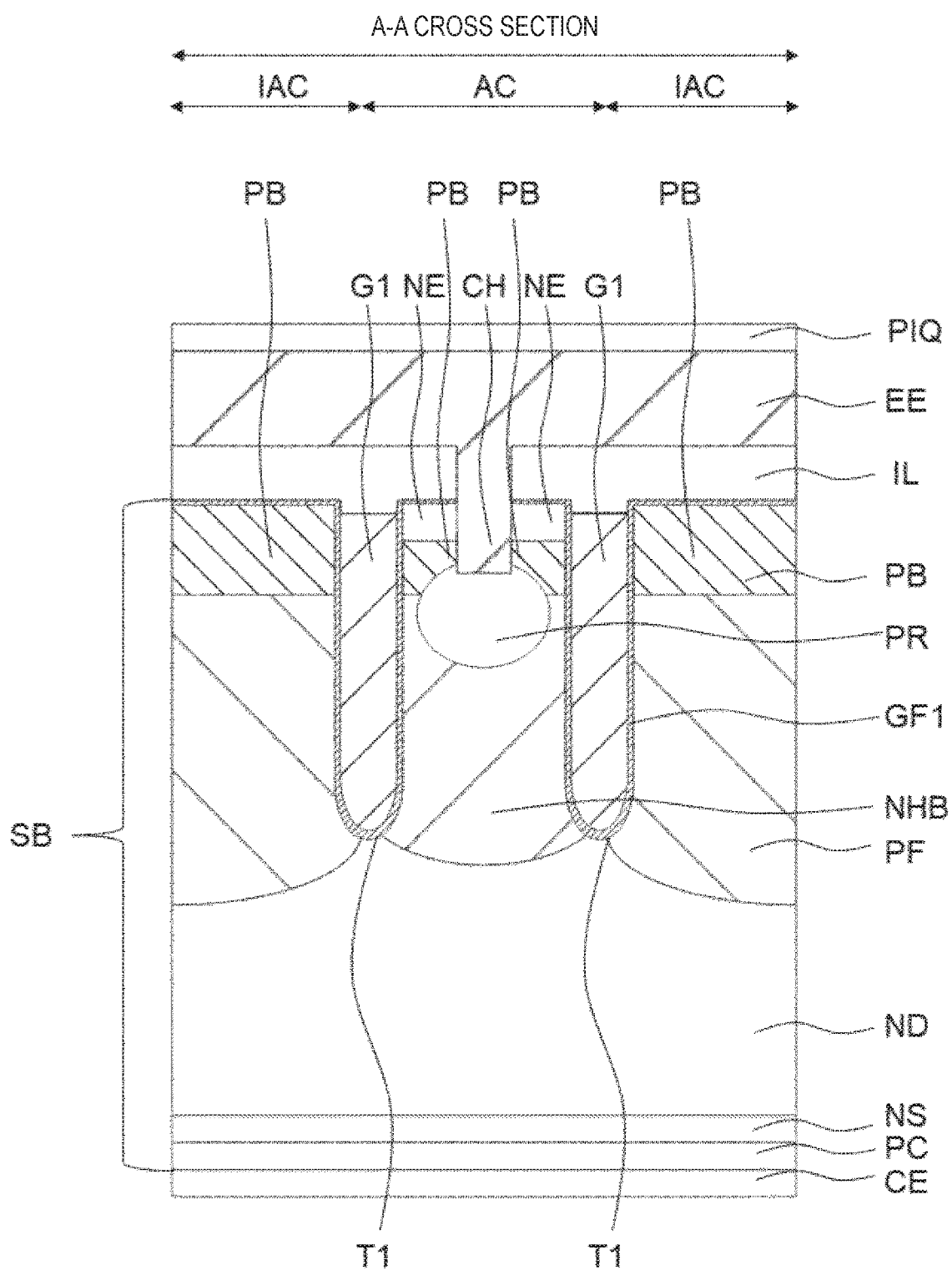
FIG. 3 is a cross-sectional view taken along the line A-A of the semiconductor chip shown in FIG. 2.

Next, cross-sectional structures of present embodiment chips CHPs will be described with reference to FIGS. 3 to 5. FIG. 3 is a cross-sectional view taken along the line A-A of the semiconductor chip CHP of FIG. 2. The A-A cross section is a cross section that passes through the active region AC and the region where the emitter region NE is formed.

In the semiconductor substrate SB, a drift region ND, which is an n-type impurity region having a concentration lower than that of an emitter region NE, which will be described later, is formed. The drift zone ND is an area in which impurities, such as phosphorous or arsenic, are injected, and the impurity concentration may be, for example, about $1.5\times10^{14}$ Atoms/cm3. An n-type field stop region NS and a p-type collector region PC are formed on the back surface of the semiconductor substrate SB, the n-type field stop region NS having an impurity density (e.g., $6.0\times10^{16}$ of Atoms/cm3) higher than that of the drift region ND, and the p-type collector region PC are formed on the back surface of the semiconductor substrate SB. The impurity concentration of the collector-region PC is, for example, about $3.0\times10^{17}$ Atoms/cm3. Further, a collector potential electrode CE made of a metal film is formed on the surface of the collector region PC. The collector potential is applied to the collector region PC through the collector potential electrode CE during the switching operation of the IGBT.

Trenches T1 are formed on the surfaces of the semiconductor substrate SB where the base regions PB are formed. The gate electrodes G1 are buried in the trenches T1 with the gate insulating film GF1 interposed therebetween. As described above, the gate electrode G1 is connected to the gate potential electrode GE, and a gate potential is applied thereto. The gate insulating film GF1 is, for example, a silicon oxide film, and the gate electrodes G1 are, for example, polycrystalline silicon films into which n-type impurities are introduced.

In the active cell region AC, an n-type hole barrier region NHB having an impurity density higher than that of the drift region ND (e.g., about $4\times10^{15}$ of Atoms/cm3) is formed in the semiconductor substrate SB between the two trenches T1. The hole barrier region NHB is formed to the same depth as or deeper than the trench T1. A p-type base region PB is formed between the surface of the hole barrier region NHB and the surface of the semiconductor substrate SB. In the p-type base region PB of the active cell region AC, an n-type emitter region NE having an impurity density higher than that of the hole barrier region NHB (e.g., about $4\times10^{19}$ of Atoms/cm3) is formed. A floating region P F is formed in the semiconductor substrate SB of the inactive cell region I AC. A p-type base region PB is formed between the floating region PF and the surfaces of the semiconductor substrate SB.

A part of the gate insulating film GF1 is formed on the emitter region NE and the base region PB, and an interlayer insulating film IL is formed on the upper surface between the part of the gate insulating film GF1 and the gate electrodes G1. Contact holes CH are formed through the interlayer insulating film IL, the gate insulating film GF, and the semiconductor substrate SB. In the active cell region AC, the contact hole CH is formed so as to be in contact with the emitter region NE and the base region PB.

The bottom portion of the contact hole CH is disposed in the base region PB and does not reach the hole barrier region NHB. At the bottom of the contact hole CH, a p-type body region PR having an impurity concentration higher than that of the base region PB is formed. The body region PR is formed so as to extend over the base region PB and the hole barrier region NHB, and is formed so as not to contact the emitter region NE in the active cell region AC. The body region PR is provided in order to lower the contact resistance with the emitter potential electrode EE buried in the contact hole CH and prevent latch-up.

An emitter potential electrode EE is formed on the interlayer insulating film IL, and the emitter potential electrode EE is buried in the contact hole CH. Therefore, in the active cell region AC, an emitter potential is applied to the emitter region NE, the base region PB, and the body region PR. A contact hole is not disposed in the floating region PF of the inactive cell region IAC. Therefore, the emitter potential and the gate potential are not applied to the floating region PF.

A protective film PIQ made of a resin such as polyimide is formed on the emitter potential electrode EE. As described with reference to FIG. 1, an opening is provided in the protective film PIQ so as to expose a part of the emitter potential electrode EE and a part of the gate potential electrode GE. That is, the protective film PIQ is not formed in the region indicated by the broken line in FIG. 1, i.e., the gate pad GP and the emitter pad EP.

Figure 4:
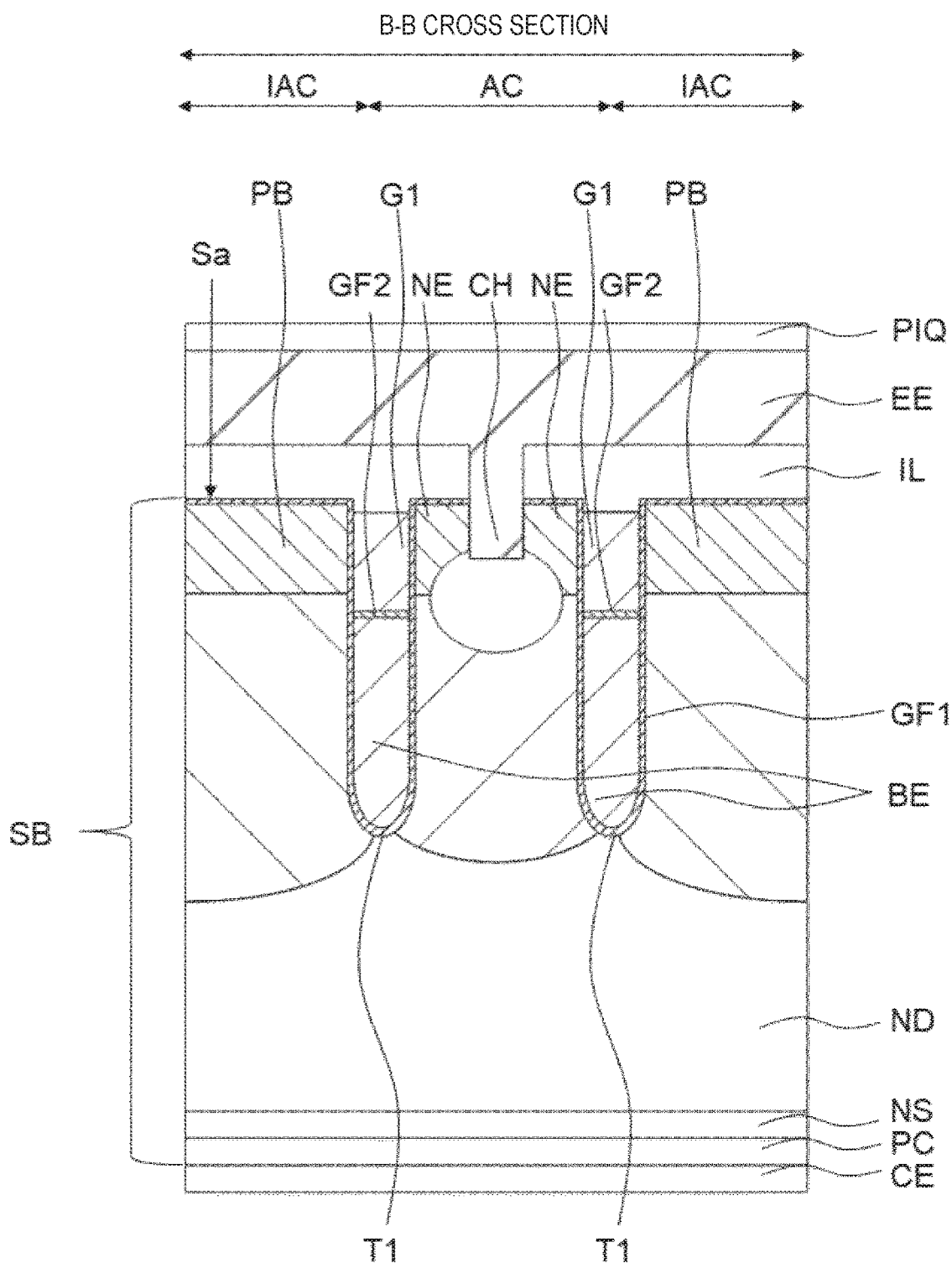
FIG. 4 is a cross-sectional view taken along the line B-B of the semiconductor chip shown in FIG. 2.

FIG. 4 is a cross-sectional view taken along the line B-B of the semiconductor chip CHP of FIG. 2. The B-B cross section is a cross section that crosses a region in the active cell region AC in which the emitter region NE is not formed. Compared to FIG. 3, the difference is that the emitter region NE is not formed in the semiconductor substrate SB of the active cell region AC, and that the in-trench insulating film GF2 is formed in the trench T1. Otherwise, the configuration is the same as that of FIG. 3, and the description thereof is omitted.

The in-trench insulating film GF2 is an insulating film formed within the trench T1, which divides the interior of the trench T1 into two regions: a side near the upper surface Sa of the semiconductor substrate SB and a side near the lower surface Sb. In the present embodiment, a region inside the trench on the upper surface Sa side of the in-trench insulating film GF2 is referred to as a gate electrode G1, and a region inside the trench on the lower surface Sb side of the in-trench insulating film GF2 is referred to as a bottom electrode BE. The bottom electrode BE is formed between the gate electrode G1 and an end portion of the trench T1 on the lower surface Sb side. The gate electrode G1 is connected to the gate potential electrode GE shown in FIG. 1 at the outer peripheral portion of the semiconductor chip CHP, but the bottom electrode BE is not connected to the gate potential electrode GE. Therefore, the gate potential is not applied to the bottom electrode BE. The bottom electrode BE is formed of, for example, a conductive film such as a polycrystalline silicon film into which an n-type impurity is introduced.

Figure 5:
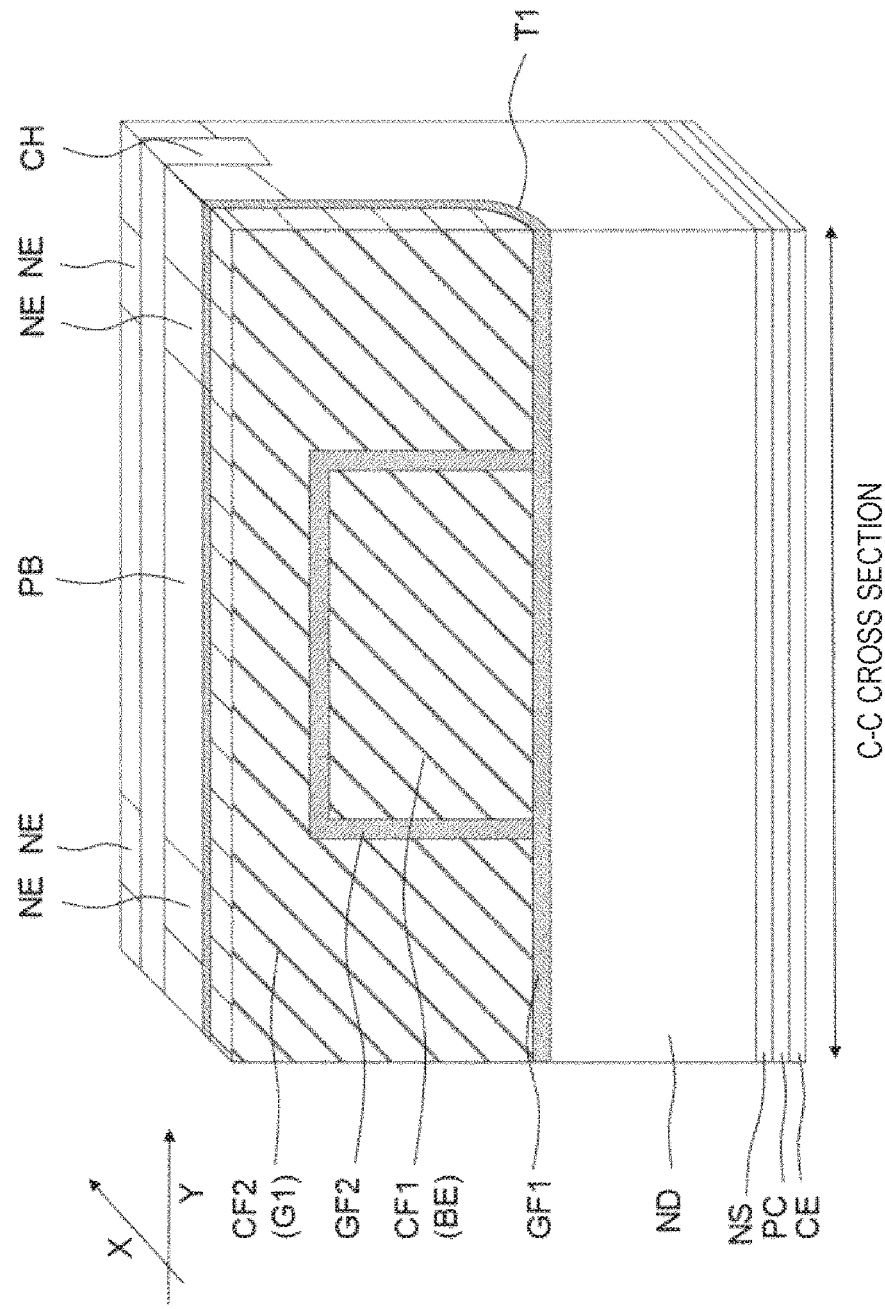
FIG. 5 is a bird's-eye view of the semiconductor chip shown in FIG. 2 when the semiconductor chip is sectioned along the line C-C.

FIG. 5 is a perspective view of a cross section of the semiconductor chip CHP of FIG. 2 taken along the line C-C, as viewed obliquely from above. The C-C cross section is a cross section obtained by cutting the gate electrode G1 along the Y direction. In FIG. 5, the protective film PIQ, the emitter potential electrode EE, and the interlayer insulating film IL are not shown. The inside of the trench T1 is divided into the gate electrode G1 and the bottom electrode BE by the in-trench insulating film GF2. The bottom electrodes BE are surrounded by the in-trench insulating film GF2 and a part of the gate insulating film GF1. As described above, since the bottom electrode BE is surrounded by the insulating film, the gate potential is not applied. In other words, the bottom electrode BE has a floating potential.

In addition, the emitter region NE is not formed on the semiconductor substrate SB on the side in the X-direction of the region RBE in which the bottom electrodes BE are formed in the trench T1. On the other hand, the emitter region NE is formed laterally in the X-direction of the region RG1 in which the bottom electrode BE is not formed in the trench T1. In other words, the gate electrode G1 having the first length is formed adjacent to the region where the emitter region NE is formed in the X direction. A gate electrode G1 having a second length shorter than the first length is formed on the side in the X direction of a region sandwiched between a plurality of emitter regions NE in the Y direction, that is, a region in which the emitter region NE is not formed. Alternatively, it can be said that the distance between the end of the lower surface Sb side of the gate electrode G1 having the first length and the collector region PC is shorter than the distance between the end of the lower surface Sb side of the gate electrode G1 having the first length and the collector region PC.

In present embodiment, "length" of the gate electrode G1 means a distance from the end portion of the gate electrode G1 on the upper surface Sa side to the end portion on the lower surface Sb side. More specifically, the thickness of the gate electrode G1 at a portion where the gate electrode G1 is formed deepest in the thickness direction of the semiconductor substrate SB is shown. The "thickness" indicates the shortest distance between the upper surface Sa of the semiconductor substrate SB and the deepest portion of the gate electrode G1. The "length" of the gate electrode G1 may be referred to as the "depth" or "thickness" of the gate electrode G1 along the thickness of the semiconductor substrate SB.

At this time, it is desirable that the second length of the gate electrode G1 is not less than the length of the base region PB in the depth direction and not more than half the length of the trench T1. The reason will be described later in the description of the effect.

The length in the Y direction of the region RG1 in which the bottom electrodes BE are not formed in the trench T1 is desirably equal to or greater than the length in the Y direction of the emitter region.

In addition, although one typical example of the region RG1 and one typical example of the region RBE has been described in the explanation of present embodiment, in reality, a plurality of regions RG1 and a plurality of regions RBE exist and are alternately arranged along the Y-direction in which the gate electrodes G1 extend.

(Manufacturing Method of Semiconductor Device)

Next, the manufacturing method of the semiconductor device according to the present embodiment will be described with reference to FIGS. 6A, 6B to 14A, and 14B.

FIG. 6A, FIG. 6B to FIG. 14A, and FIG. 14B are the cross-sectional view showing the manufacturing process of present embodiment semiconductor chips CHPs. FIGS. 6A, 7A to 13A and 14A show the cross sections taken along the line A-A in FIG. 2, and FIGS. 6B, 7B to 13B and 14B show the cross sections taken along the line B-B in FIG. 2.

Figure 6A:
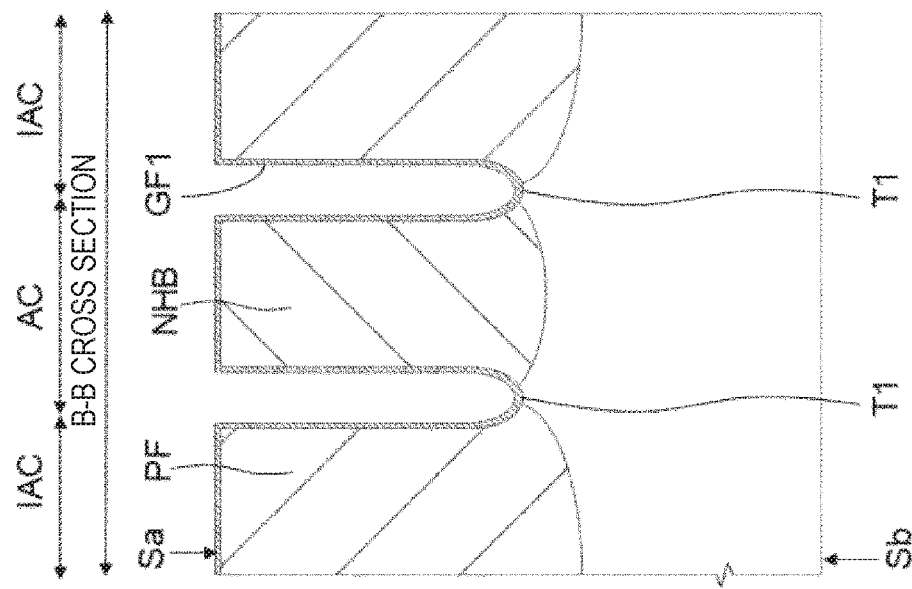
FIG. 6A is an A-A cross-sectional view showing the manufacturing process according to the first embodiment semiconductor chip.
Figure 6B:
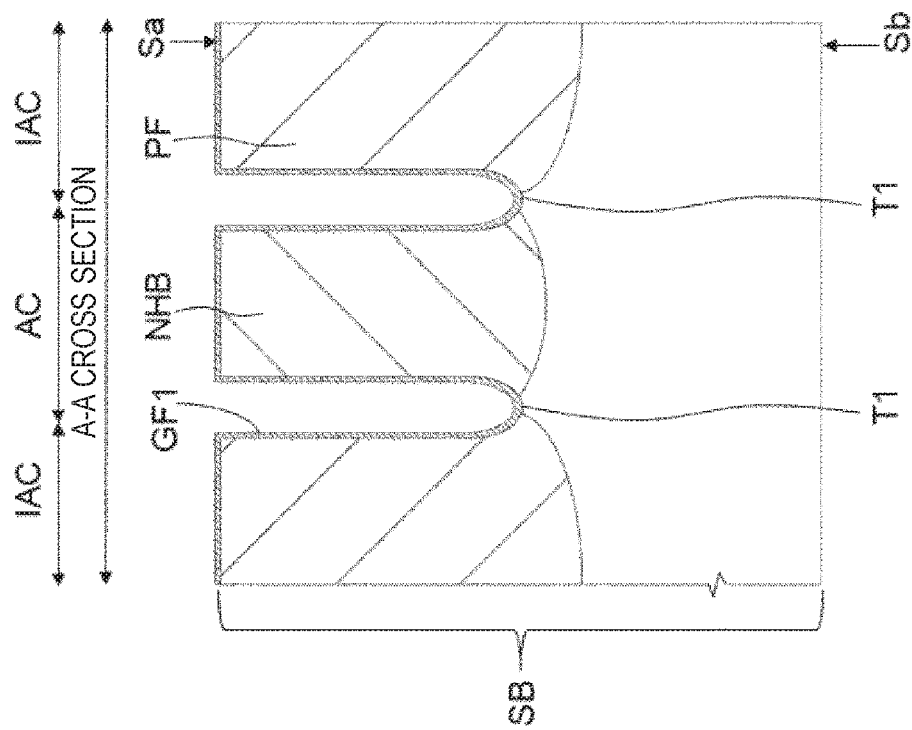
FIG. 6B is a B-B cross-sectional view showing the manufacturing process according to the first embodiment semiconductor chip.

First, as shown in FIGS. 6A and 6B, a semiconductor substrate SB made of a silicon single crystal into which an n-type impurity such as phosphorus is introduced is prepared. The semiconductor substrate SB has an upper surface Sa as a first main surface and a lower surface Sb as a second main surface opposed to the upper surface Sa. Then, a trench T1, a gate insulating film GF1, a hole barrier region NHB, and a floating region PF are formed in the semiconductor substrate SB.

Figure 7B:
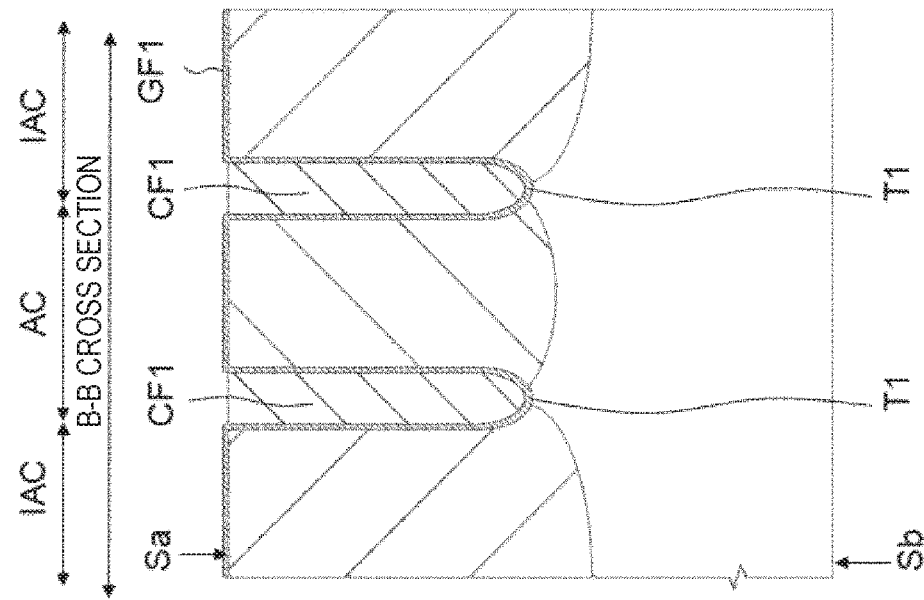
FIG. 7B is a B-B cross-sectional view showing the manufacturing process according to the first embodiment semiconductor chip.
Figure 7A:
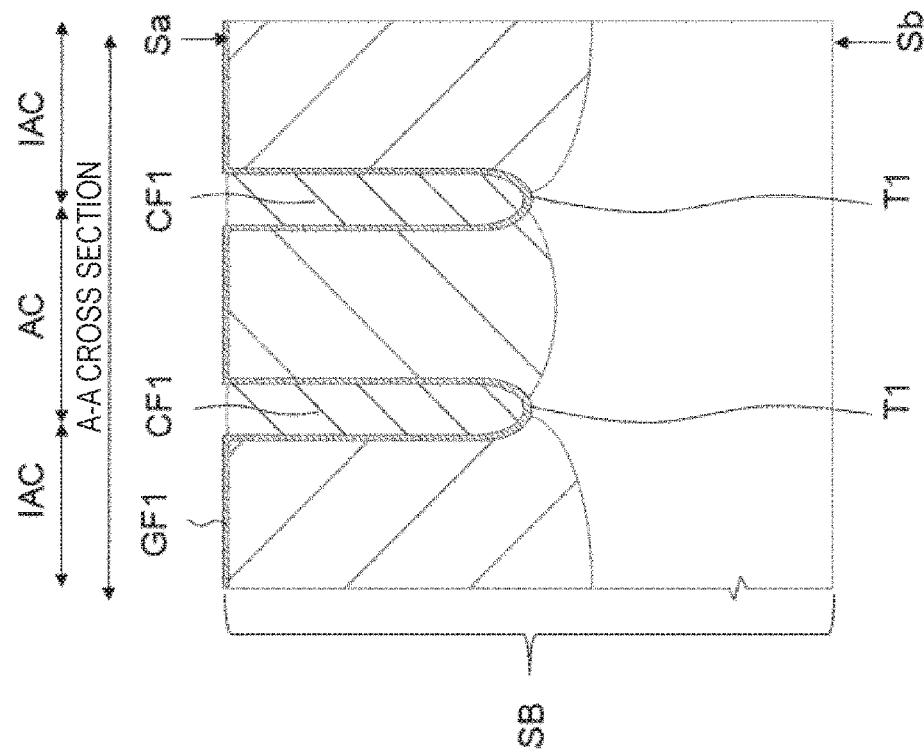
FIG. 7A is an A-A cross-sectional view showing the manufacturing process according to the first embodiment semiconductor chip.

Next, as shown in FIGS. 7A and 7B, a conductive film CF1 made of a polysilicon (Doped Poly-Silicon) film doped with phosphorus is formed on the upper surface Sa of the semiconductor substrate SB and in the trench T1 by, for example, a CVD (Chemical Vapor Deposition) method. The thickness of the conductive film CF1 is, for example, about 0.5 um to 1.5 um. Then, the conductive film CF1 formed outside the trench T1 is removed by, e.g., dry-etching. As an etching gas of the dry etching method, for example, SF6 gas or the like can be exemplified as a suitable gas.

Figure 8B:
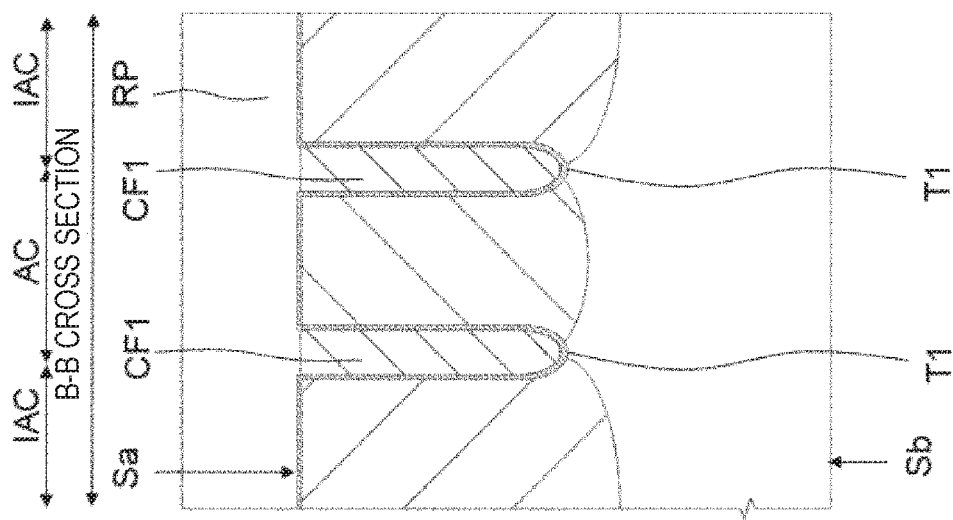
FIG. 8B is a B-B cross-sectional view showing the manufacturing process according to the first embodiment semiconductor chip.
Figure 8A:
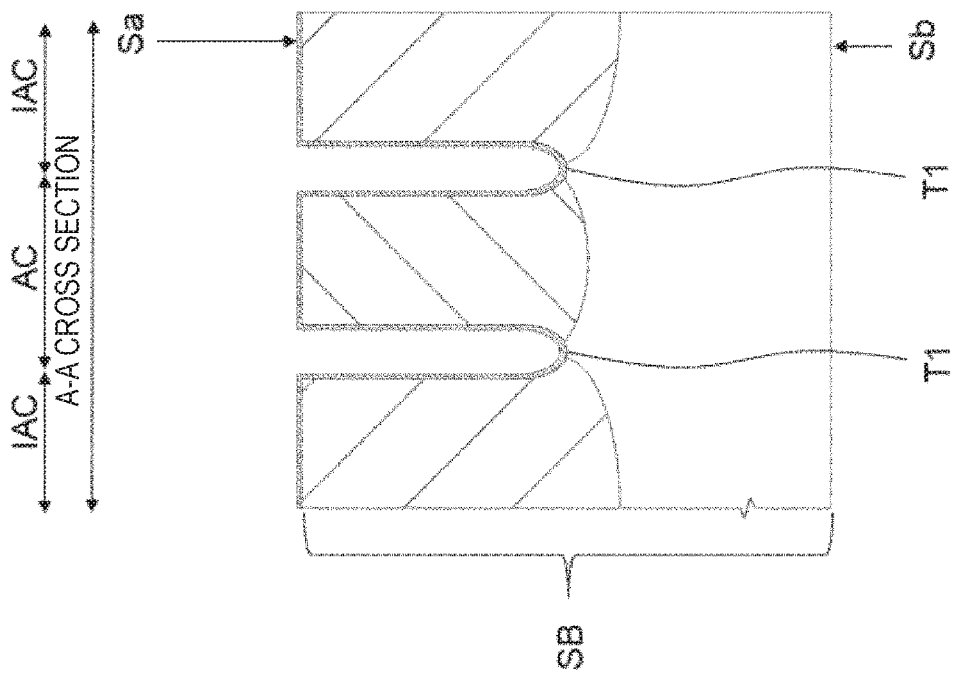
FIG. 8A is an A-A cross-sectional view showing the manufacturing process according to the first embodiment semiconductor chip.

Next, as shown in FIG. 8B, a resist pattern RP is formed in the region of the B-B cross section. At this time, as shown in FIG. 8A, the resist pattern RP is not formed in the region of the A-A cross section. Then, the conductive film CF1 in the trench T1 of the A-A cross section is removed by dry etching.

Figure 9A:
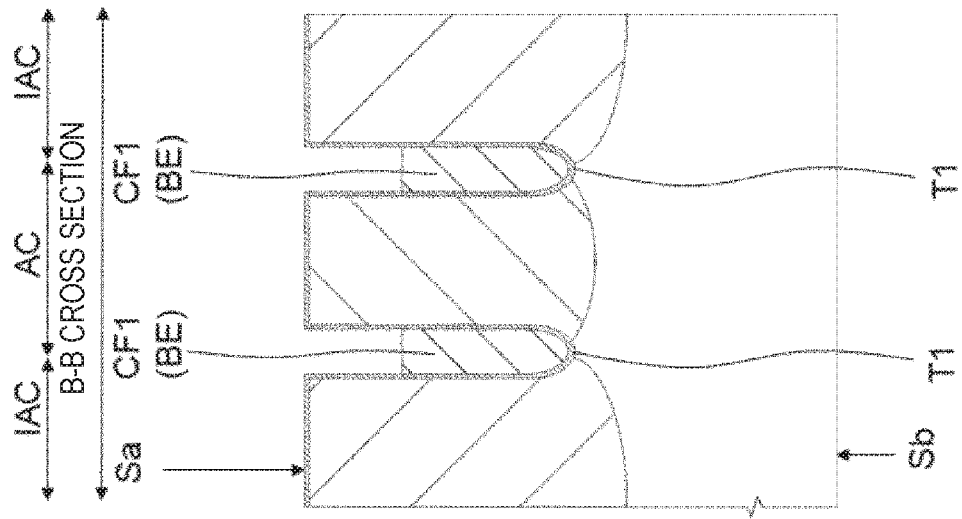
FIG. 9A is an A-A cross-sectional view showing the manufacturing process according to the first embodiment semiconductor chip.
Figure 9B:
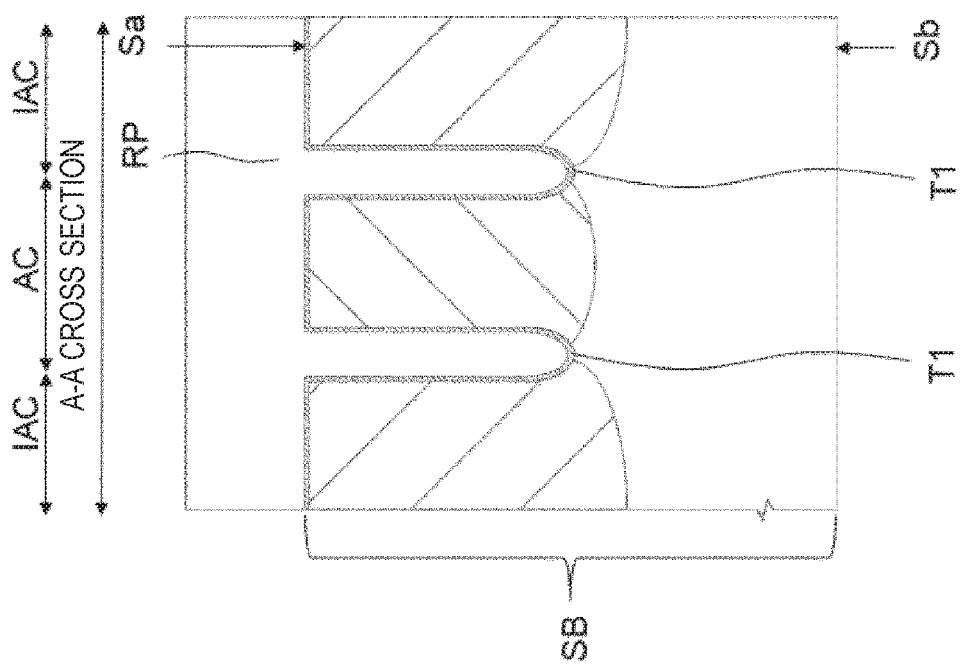
FIG. 9B is a B-B cross-sectional view showing the manufacturing process according to the first embodiment semiconductor chip.

Next, as shown in FIG. 9B, the resist pattern RP left in the region of the B-B cross section is removed, and as shown in FIG. 9A, a resist pattern RP is newly formed in the region of the A-A cross section. Then, as shown in FIG. 9B, a part of the conductive film CF1 in the trench T1 in the B-B cross-sectional area is removed by dry etching. At this time, not all of the conductive film CF1 existing in the trench T1 is removed, but a part of the conductive film CF1 remains in the trench T1. The partially remaining conductive film CF1 corresponds to the bottom electrodes BEs in FIGS. 4 and 5.

Figure 10A:
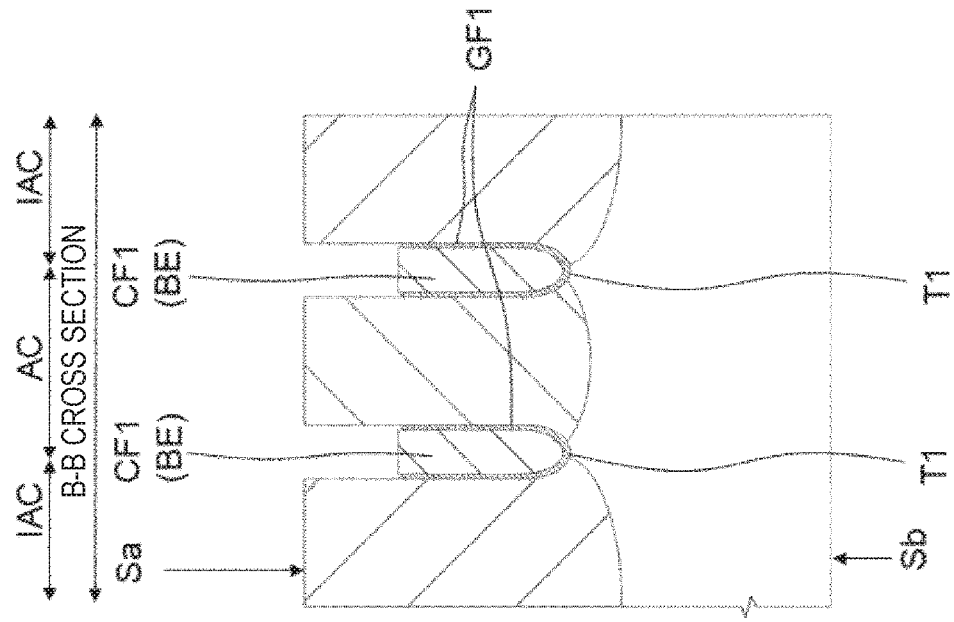
FIG. 10A is an A-A cross-sectional view showing the manufacturing process according to the first embodiment semiconductor chip.
Figure 10B:
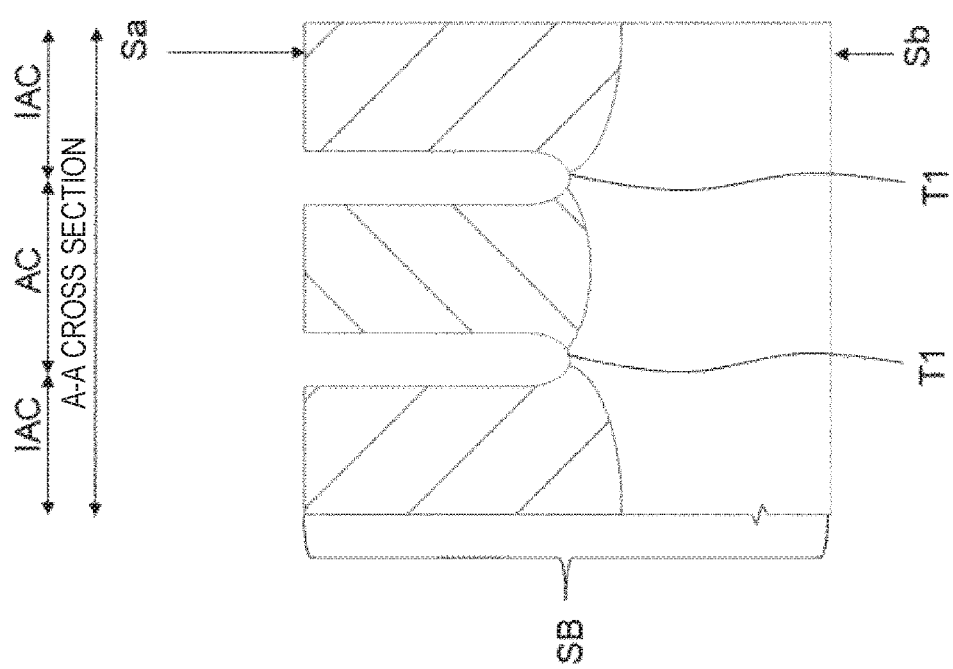
FIG. 10B is a B-B cross-sectional view showing the manufacturing process according to the first embodiment semiconductor chip.

Next, as shown in FIG. 10A, the resist pattern RP existing in the region of the A-A cross section is removed. Thereafter, a portion of the gate insulating film GF1 is removed by dry etching. At this time, as shown in FIG. 10B, in the B-B cross-sectional area, the gate insulating film GF1 existing between the conductive film CF1 and the inner wall of the trench T1 partially left in the process of FIG. 9 is not removed and remains. As an etching gas of the dry etching method, for example, a SF6 gas or the like can be exemplified as a suitable gas.

Figure 11A:
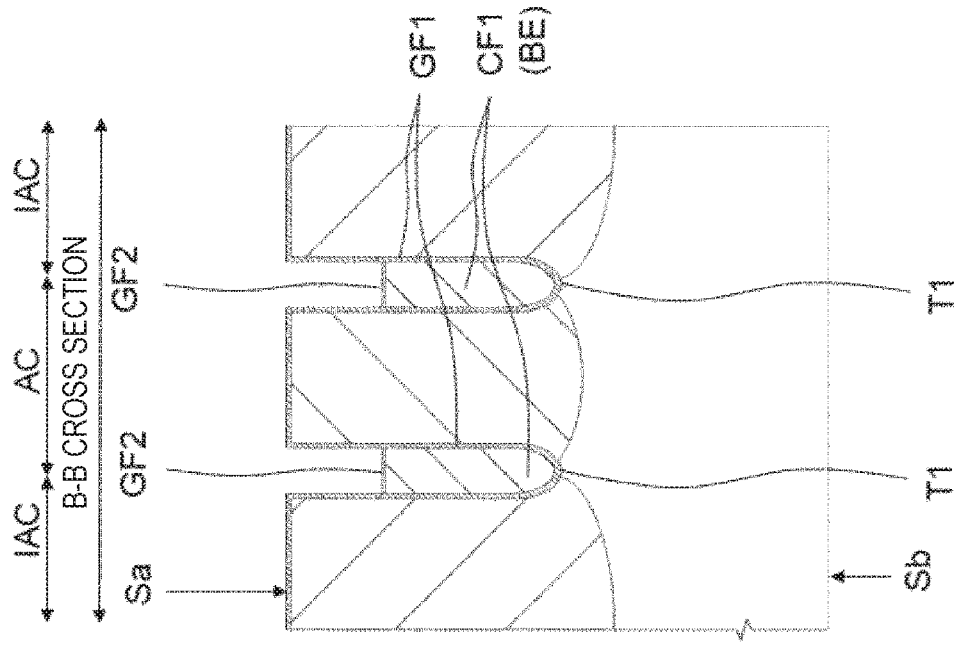
FIG. 11A is an A-A cross-sectional view showing the manufacturing process according to the first embodiment semiconductor chip.
Figure 11B:
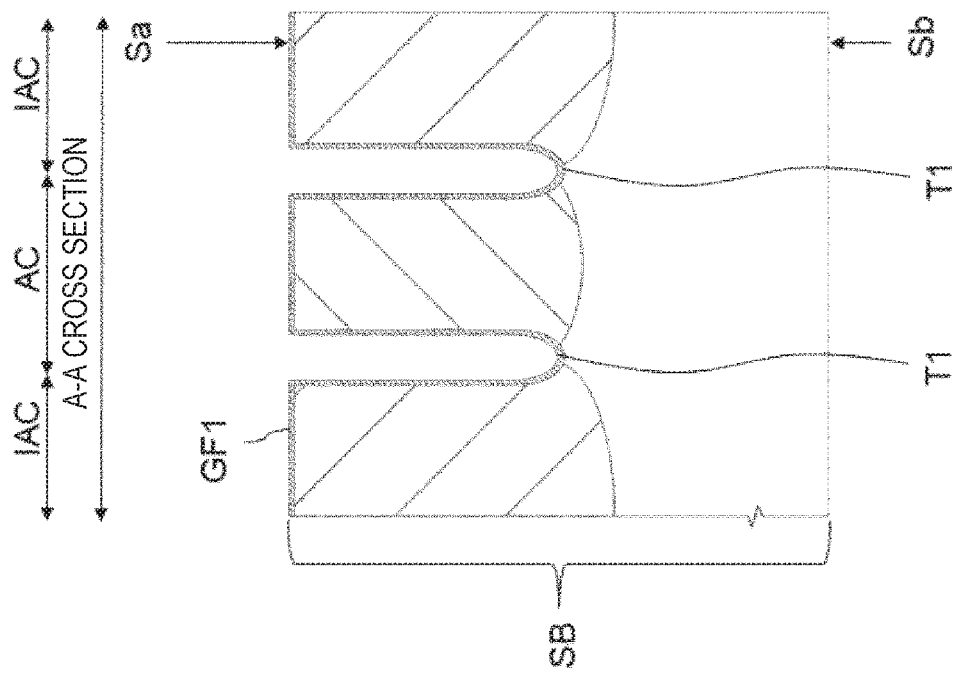
FIG. 11B is a B-B cross-sectional view showing the manufacturing process according to the first embodiment semiconductor chip.

Next, as shown in FIGS. 11A and 11B, the gate insulating film GF1 made of, for example, a silicon oxide film is formed again on the upper surface Sa of the semiconductor substrate SB and on the inner wall of each of the trenches T1 by, for example, a thermal oxidation method or the like. At this time, the in-trench insulating film GF2 is also formed at the same time on the upper surface of the conductive film CF1.

Figure 12A:
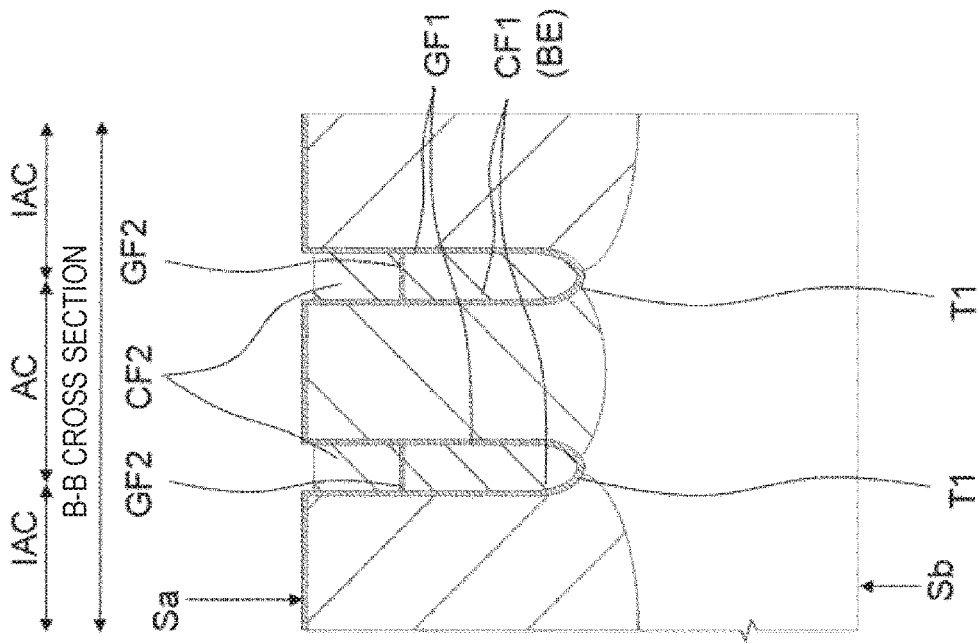
FIG. 12A is an A-A cross-sectional view showing the manufacturing process according to the first embodiment semiconductor chip.
Figure 12B:
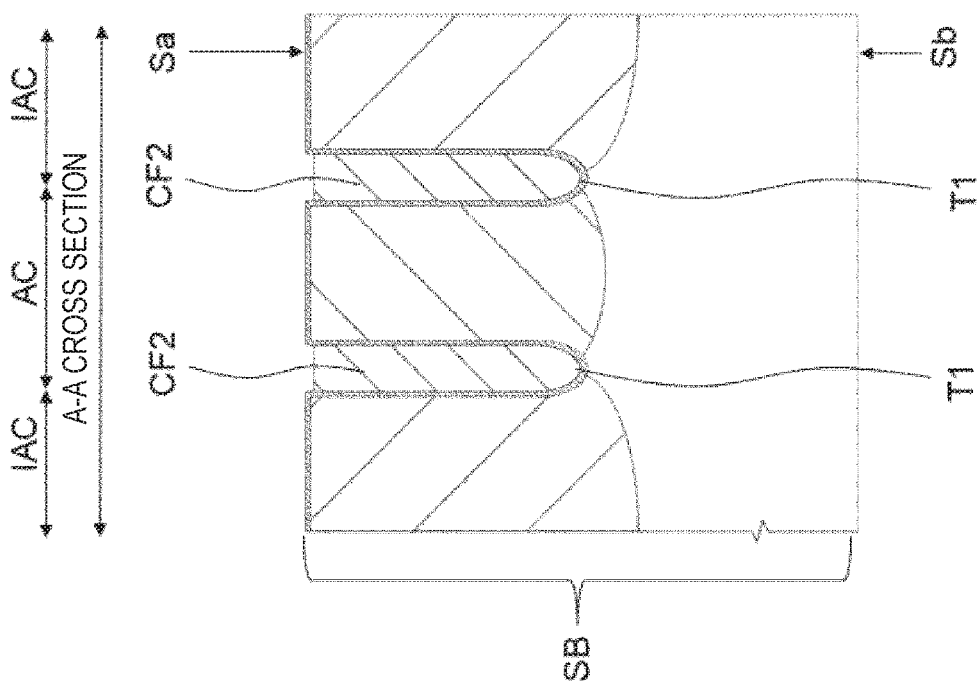
FIG. 12B is a B-B cross-sectional view showing the manufacturing process according to the first embodiment semiconductor chip.

Next, as shown in FIGS. 12A and 12B, a conductive film CF2 made of a polysilicon (Doped Poly-Silicon) film doped with phosphorus is formed on the upper surface Sa of the semiconductor substrate SB and in the trench T1 by, for example, a CVD (Chemical Vapor Deposition) method. Then, the conductive film CF2 on the upper surface Sa of the semiconductor substrate SB is removed by, e.g., dry etching. The conductive film CF2 remaining inside the trench T1 is finally used as the gate electrode G1.

Figure 13A:
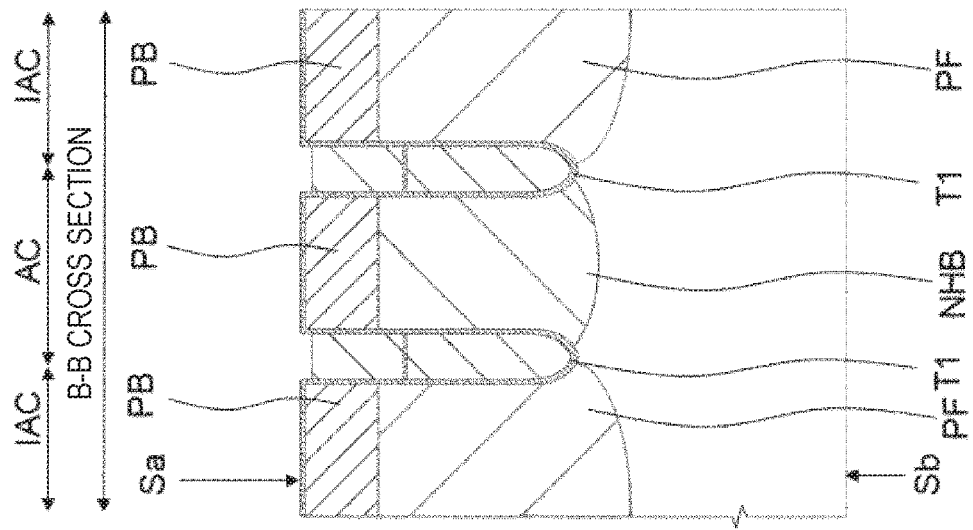
FIG. 13A is an A-A cross-sectional view showing the manufacturing process according to the first embodiment semiconductor chip.
Figure 13B:
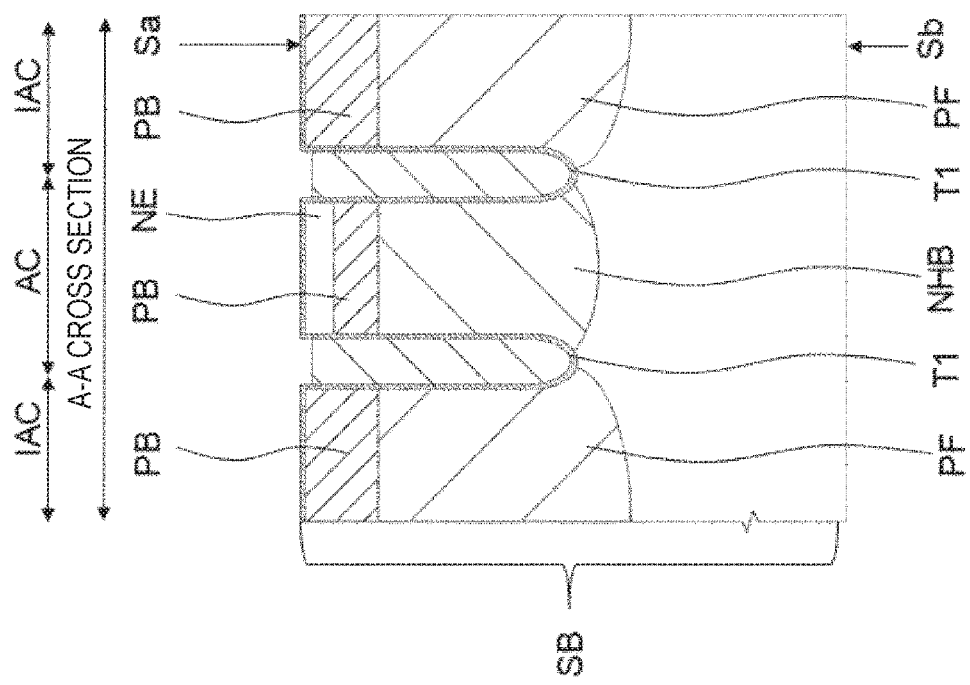
FIG. 13B is a B-B cross-sectional view showing the manufacturing process according to the first embodiment semiconductor chip.

Next, as shown in FIGS. 13A and 13B, a p-type base region PB is formed on the surface of each of the floating region PF and the hole barrier region NHB by photolithography and ion implantation. The base region PB is an impurity region having an impurity concentration higher than that of the floating region PF. Next, as shown in FIG. 13A, an n-type emitter region NE is formed on the surface of the base region PB of the active cell region AC in the region of the A-A cross section by using a photolithography method and an ion implantation method. The emitter region NE is an impurity region having an impurity concentration higher than that of the hole barrier region NHB. At this time, the emitter region NE is not formed in the base region PB of the inactive cell region IAC.

Figure 14A:
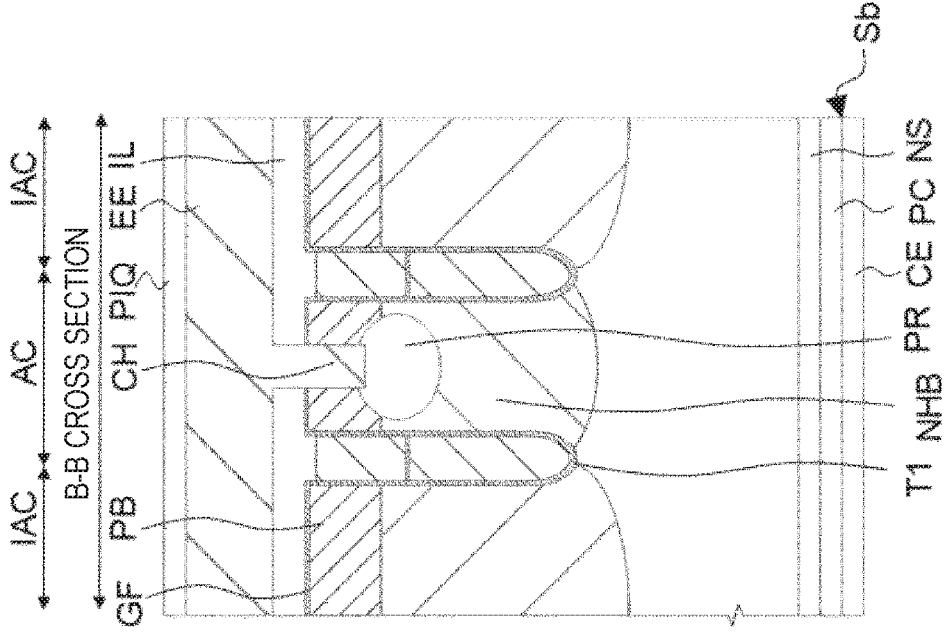
FIG. 14A is an A-A cross-sectional view showing the manufacturing process according to the first embodiment semiconductor chip.
Figure 14B:
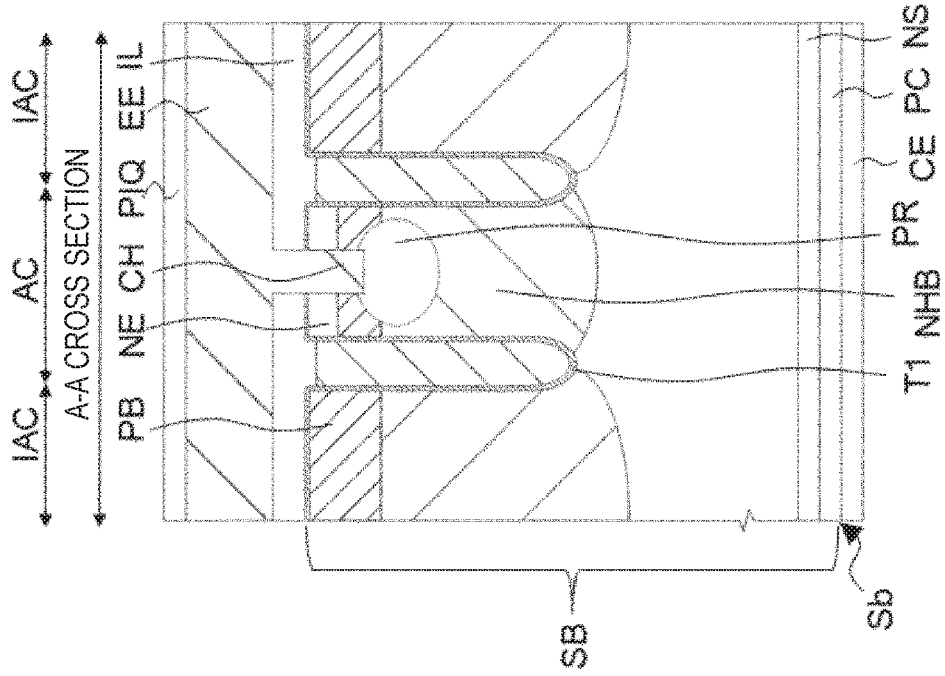
FIG. 14B is a B-B cross-sectional view showing the manufacturing process according to the first embodiment semiconductor chip.

Next, as shown in FIGS. 14A and 14B, an interlayer insulating film IL made of, for example, a silicon oxide film is formed on the gate insulating film GF1 formed in the trench T1 by, for example, a CVD method. Next, contact holes CH are formed in the interlayer insulating film IL and the gate insulating film GF1 by photolithography and dry etching. The bottom portion of the contact hole CH is formed to penetrate a portion of the semiconductor substrate SB and reach the base region PB. That is, the contact hole CH is formed so as to be in contact with the emitter region NE and the base region PB of the active cell region AC.

Next, a p-type body region PR is formed at the bottom of the contact hole CH by using an ion implantation method. The body region PR is an impurity region having an impurity concentration higher than that of the base region PB and is formed so as to extend over the base region PB and the hole barrier region NHB. The body region PR of the active cell region AC is formed so as not to contact the n-type emitter region NE. Thereafter, heat treatment for activating each impurity region is performed.

Next, an aluminum film, for example, is formed on the interlayer insulating film IL by using, for example, a sputtering method so as to fill the contact hole CH. Thereafter, the aluminum film is patterned by photolithography and dry etching to form an emitter potential electrode EE. The gate potential electrode GE shown in FIG. 1 is also formed by patterning the aluminum film.

Before the formation of the aluminum film, a barrier metal film made of, for example, a titanium nitride film may be formed, and the aluminum film may be formed on the barrier metal film. That is, the emitter potential electrode EE and the gate potential electrode GE may be a laminated film of a barrier metal film and an aluminum film. In the present embodiment, illustration of the barrier metal film is omitted.

Next, a protective film PIQ made of a resin such as polyimide is formed by using, for example, a coating method so as to cover the emitter potential electrode EE and the gate potential electrode GE. Thereafter, an opening is formed in a part of the protective film PIQ by photolithography and dry etching, whereby a part of the emitter potential electrode EE and a part of the gate potential electrode GE are exposed from the opening. This exposed region becomes the emitter pad EP and the gate pad GP shown in FIG. 1.

Next, the lower surface Sb of the semiconductor substrate SB is polished to reduce the thickness of the semiconductor substrate SB. Next, ion implantation is performed from the lower surface Sb of the semiconductor substrate SB. This ion implantation is performed by using a photolithography method and dry etching, whereby an n-type field stop region NS and a p-type collector region PC are formed. The field stop region NS is an impurity region having an impurity concentration higher than that of the drift region ND.

Next, collector potential electrodes CE made of a metallic film such as a titanium nitride film are formed on the surface of the collector regions PC exposed on the lower surface Sb of the semiconductor substrate SB by, for example, a sputtering method or a CVD method.

As described above, the semiconductor device according to first embodiment is manufactured.

Figure 15:
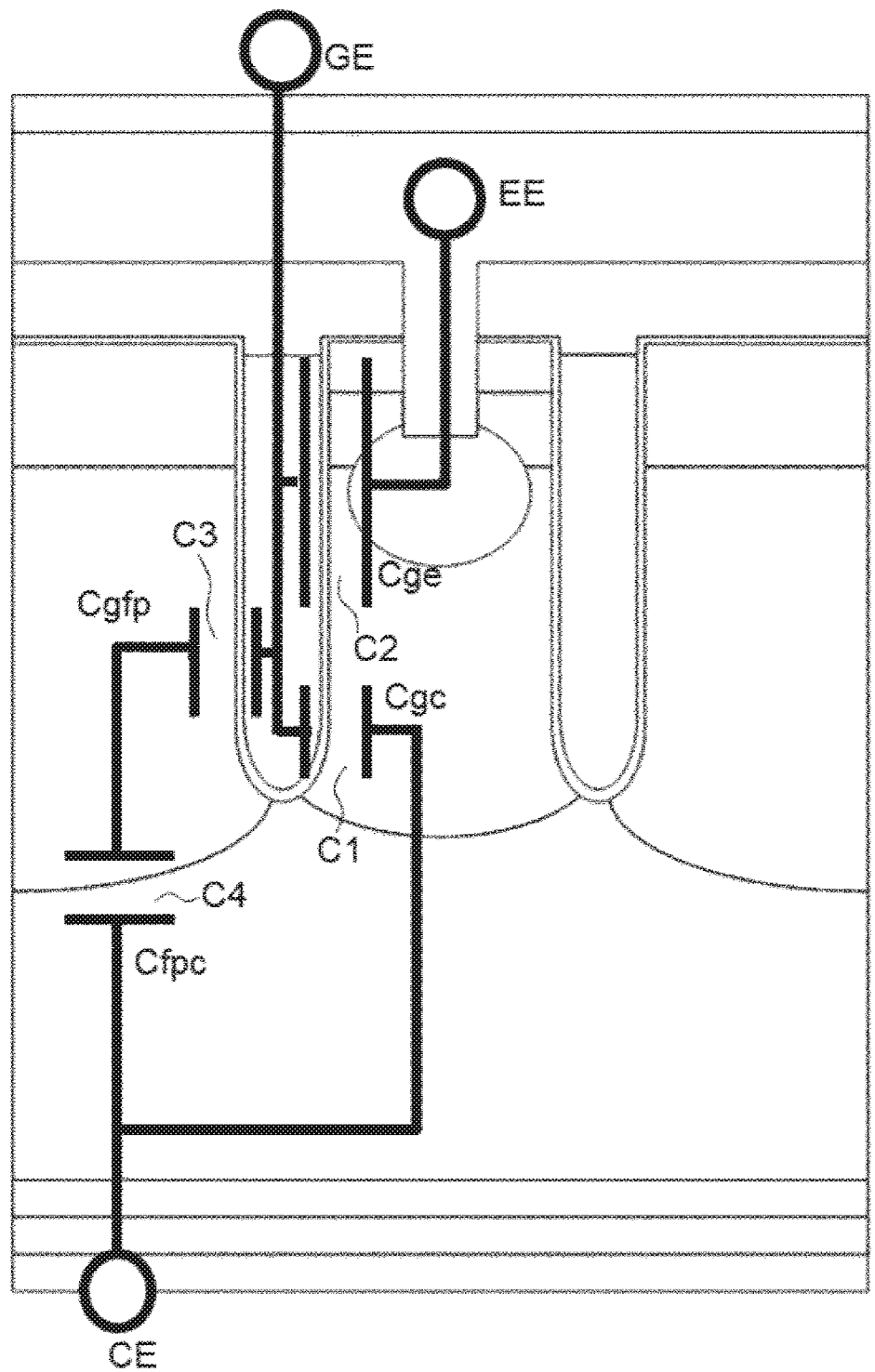
FIG. 15 is an explanatory diagram for explaining capacitive components at the time of operation of the IGBT.

Next, the effects of the examined example and present embodiment discussed by the present inventor will be described with reference to FIGS. 15 to 17. FIG. 15 is an explanatory diagram for explaining capacitance components during operation of the GG-type structural IGBT having floating regions. Although FIG. 15 is a cross-sectional view, hatching is omitted for clarity of explanation.

As shown in FIG. 15, IGBT can be represented by equivalent circuits using a collector potential electrode CE, an emitter potential electrode EE, a gate potential electrode GE, and capacitors C1, C2, C3, and C4.

The capacitance C1 is a capacitance generated between the gate electrode and the collector region, and its capacitance value is Cgc. The capacitance C2 is a capacitance generated between the gate electrode and the emitter region, and its capacitance value is Cge. Similarly, the capacitance C3 is a capacitance generated between the gate potential electrode GE and the floating region PF, and the capacitance value of the gate potential electrode GE and the floating region PF is Cgfp.

The capacitance C4 is the capacitance generated between the collector potential electrode CE and the floating region PF, with the capacitance value as a Cfpc.

Here, among the capacitances generated in the IGBT, the feedback capacitance is largely related to the switching loss in particular, and therefore, it is required to reduce the switching loss. Assuming that the capacitance of the feedback capacitor is Cres, the Cres is expressed by the following equation [1].

$$Cres = (Cfpc * Cgfp)/(Cfpc + Cgfp) + Cgc \qquad [1]$$

Here, the present inventors have investigated how to reduce the Cres by shortening the length of the gate electrodes. When the length of the gate electrode is shortened, the area where the gate electrode and the semiconductor substrate face each other is reduced, so that Cfpc and Cgc are reduced. As Cfpc and Cgc are reduced, Cres is reduced by equation [1].

However, when the length of the gate electrode is shorter than the depth of the base region, the gate electrode does not have IGBT channels. In addition, by shortening the gate electrode, a region in which the floating region PF can be formed is reduced, resulting in a problem that the IE effect is reduced.

FIG. 16A shows the cross-sectional view of Sample A, FIG. 16B shows the cross-sectional view of Sample B, FIG. 16C shows the cross-sectional view of Sample C, FIG. 16D shows the cross-sectional view of Sample D, and FIG. 16E shows the cross-sectional view of Sample E. FIG. 16F is a simulation result obtained by calculating the relationship between the length of the gate electrode and the capacitance value (Cies) of the input capacitance, FIG. 16G is a simulation result obtained by calculating the relationship between the length of the gate electrode and the capacitance value (Cres) of the feedback capacitance, and FIG. 16H is a simulation result obtained by calculating the relationship between the length of the gate electrode and the capacitance value (Coes) of the output capacitance. In any of the drawings, the horizontal axis represents the length of the gate electrode, and the vertical axis represents the capacitance value. Sample A, Sample B, Sample C, Sample D, and Sample E are prepared in order from the shorter length of the gate electrode. In the simulations, capacitance values are measured when the emitter-collector voltages are 0 V. According to FIG. 16G, it can be seen that the longer the length of the gate electrode, the greater the Cres of the gate electrode.

Figure 17:
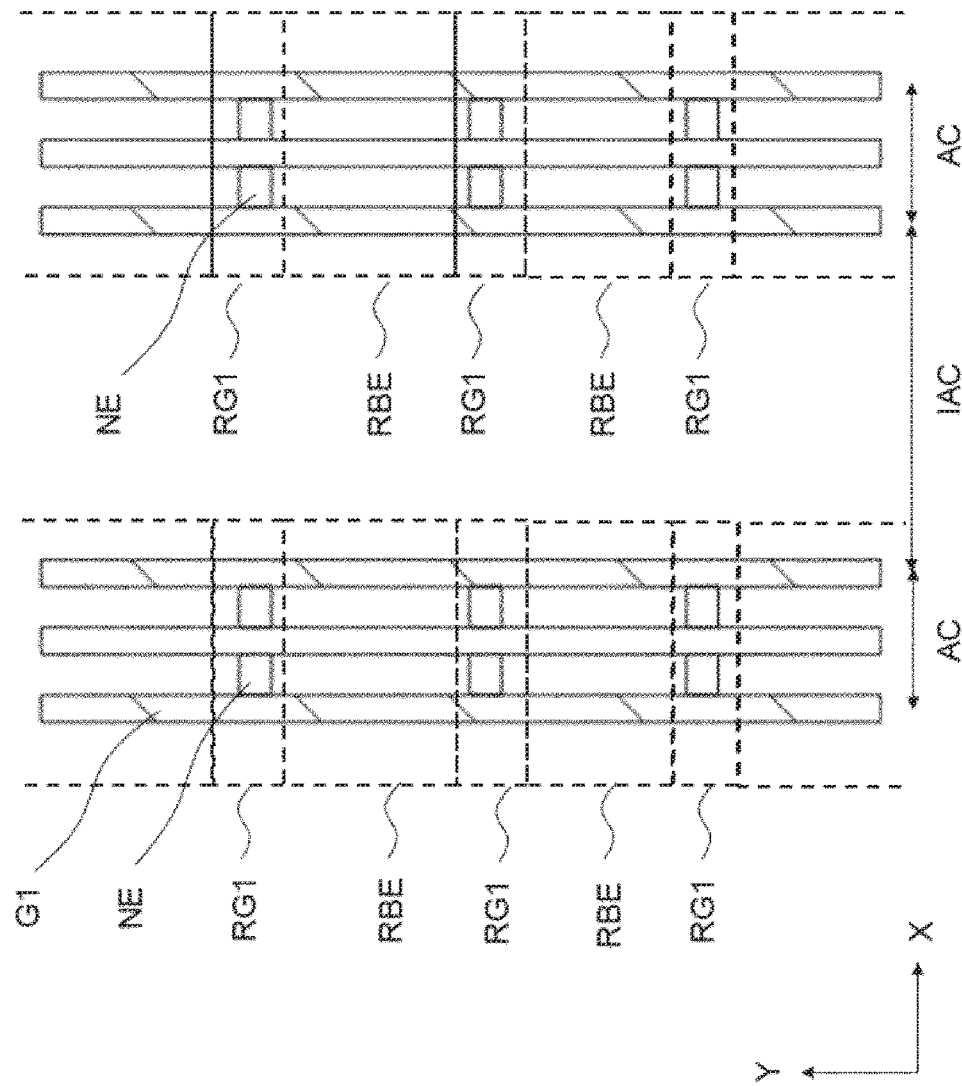
FIG. 17 is an explanatory diagram for explaining the content of study by the present inventor.

FIG. 17 is an explanatory diagram for explaining the details of the study performed by the present inventor in order to solve the above problem. In FIG. 17, a plurality of emitter regions are provided apart from each other so that, when a load such as a light of a vehicle is short-circuited for some reason, the IGBT elements driving the load are not destroyed. If the loads are short-circuited, a counter electromotive voltage (off-surge voltage) may be generated with a change in current when the IGBT is turned off. When the off-surge voltage becomes equal to or higher than the rated voltage, element breakdown occurs. Therefore, as shown in FIG. 17, the emitter regions are spaced apart from each other to reduce the area of the emitter regions. By reducing the area, the amount of current flowing through the emitter-collector area can be limited and breakdown of the IGBT can be prevented.

With this configuration, in the region RG1 in which the emitter region NE is formed, a sufficient current flows between the emitter and the collector through the emitter region NE. However, in the region RBE away from the emitter region NE, since the amount of electrons supplied from the emitter potential electrode EE is small, a sufficient current for driving the load does not flow between the emitter collectors. In other words, in the active cell region AC, the region RG1 is a region which mainly functions as an IGBT, and the region RBE is a region which has a low capability of functioning as an IGBT in the active cell region AC. That is, in the active cell region AC, the region RG1 in contact with the emitter region NE is the main driving portion for performing the switching operation of the IGBT, and in the active cell region AC, the region RBE not including the emitter region NE is the sub driving portion of the IGBT. By making the length of the gate electrode G1 of the region RBE which does not greatly affect the amount of current flowing between the emitter collectors shorter than the length of the gate electrode G1 of the region RG1 which controls much of the amount of current flowing between the emitter collectors, the Cres can be reduced without greatly affecting the amount of current flowing between the emitter collectors.

The length of the region RG1 in the Y-direction is desirably the same as the length of the emitter region NE or longer than the length of the emitter region NE at a minimum.

The length of the gate electrode RG1 in the region RBE is preferably equal to or less than half the length of the trench. As shown in FIGS. 16G and 16H, Cres and Coes increase in proportion to the length of the gate electrode G1, but as shown in FIG. 16F, Cies is highest in the sample D (i.e., when the length of the gate electrode G1 is approximately one-third of the length of the trench T1). Therefore, according to FIGS. 16F, 16G, and 16H, it is desirable that the length of the gate electrode G1 is equal to or less than the sample C, that is, the length of the gate electrode G1 is equal to or less than half of the length of the trench T1, in order to obtain the effects of reducing all of the Cres, the Coes, and the Cies.

In the region RBE, the length of the gate electrode G1 can be made shorter than the depth of the channel formation region, that is, the base region PB. In the case of shortening, since no channel is formed in the region RBE, the current flowing between the collector and the emitter is eliminated, but the capacitance can be further reduced. However, when the length of the gate electrode G1 is shortened, the cross-sectional area of the gate electrode G1 along the extending direction of the gate electrode G1 decreases, and therefore, there arises a problem that the gate resistance rises. Therefore, the length of the gate electrode G1 is desirably longer than the depth of the base region PB.

In addition, it is desirable that the length of the trench T1 is not changed between the region RBE and the region RG1 as in present embodiment, but only the length of the gate electrode G1 is changed. When the length of the trench T1 is changed between the region RBE and the region RG1, the gate capacitance can be reduced, but the gate capacitance is reduced because the region where the floating region PF is formed is reduced.

Although the boundary line between the region RG1 and the region RBE has been described by the broken line, the driving capability of the IGBT is not switched to the boundary line, and the driving capability is higher in the region closer to the emitter region NE, and the driving capability is lower in the region farther from the emitter region NE.

In addition, although the GG type structure IGBT has been described as an example in the present embodiment, the application of present embodiment is not limited to the GG type structure IGBT, and present embodiment can be applied as long as the gate electrode has a trench structure such as a GG type structure IGBT or an EGE type structure IGBT.

Second Embodiment

Figure 18A:
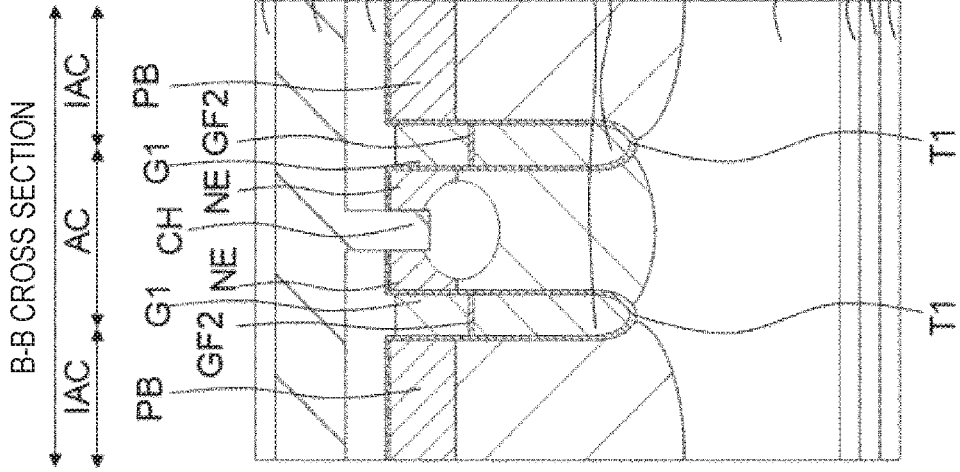
FIG. 18A is a cross-sectional view along the line A-A of the second embodiment semiconductor chip.
Figure 18B:
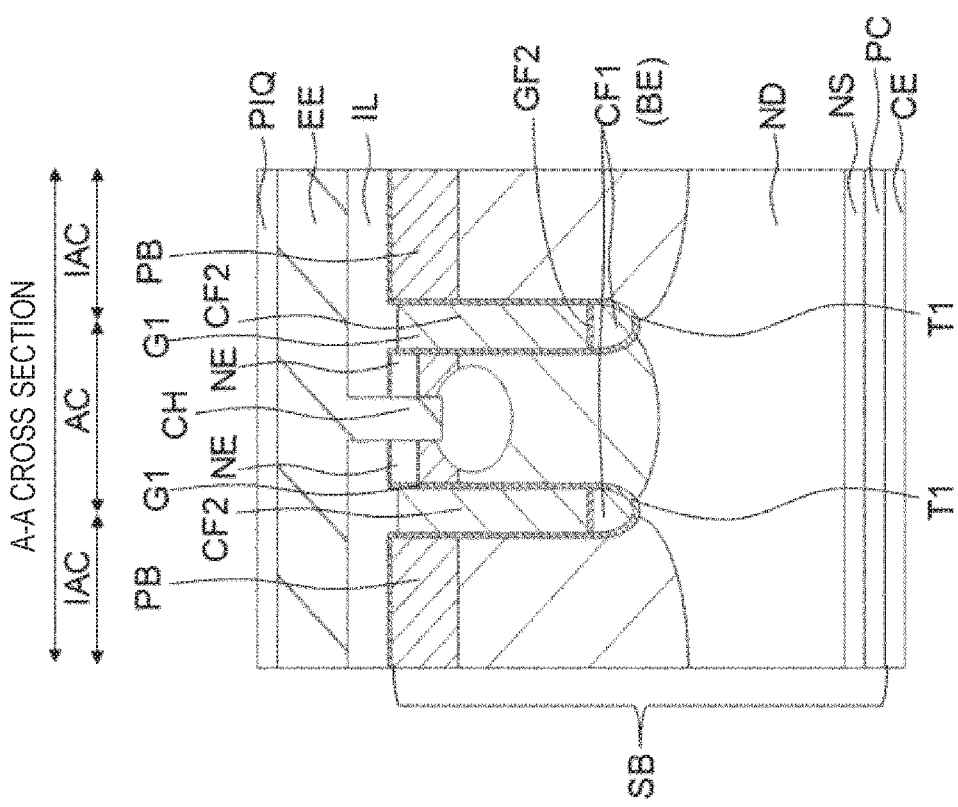
FIG. 18B is a cross-sectional view along the line B-B of the second embodiment semiconductor chip.
Figure 19:
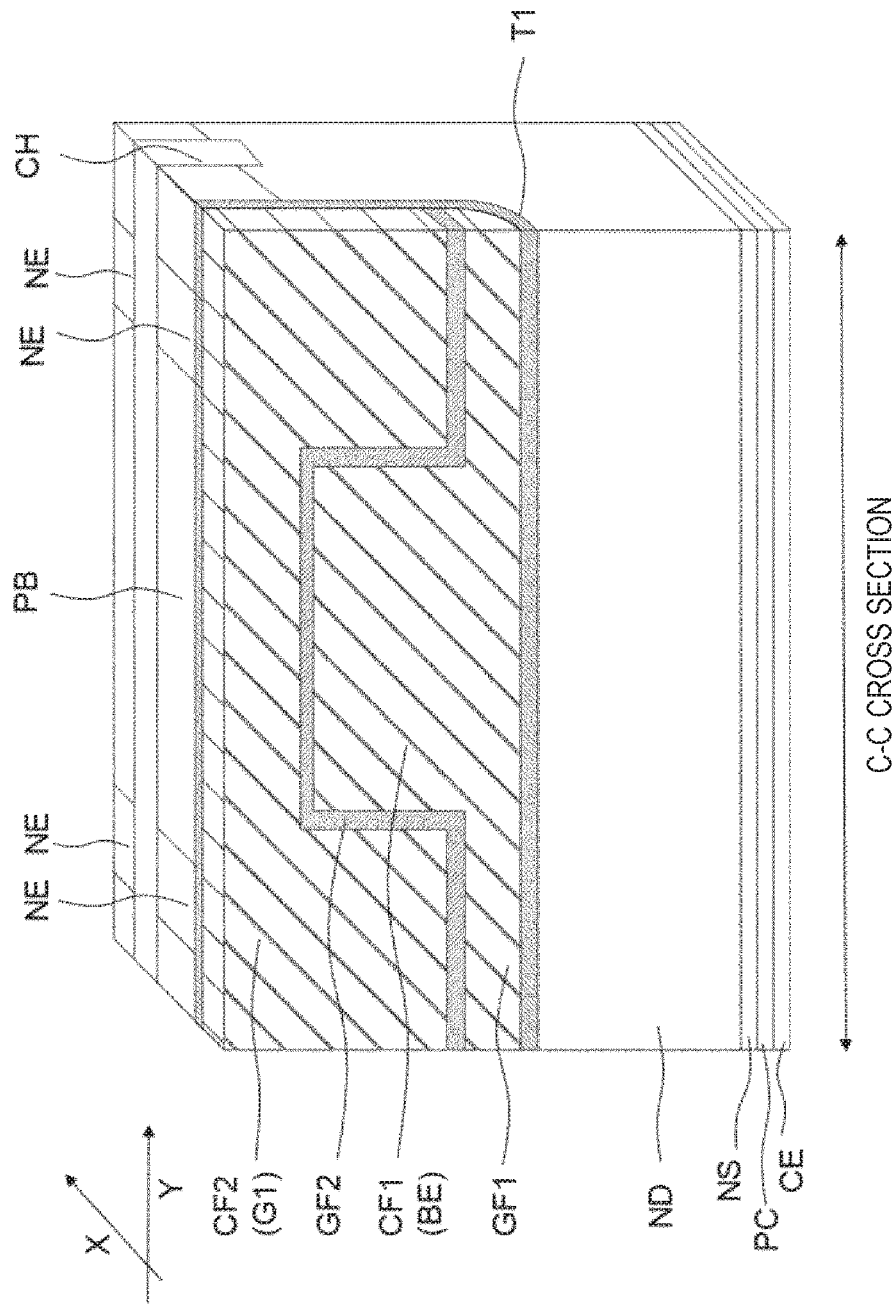
FIG. 19 is a cross-sectional view along the line C-C of the second embodiment chips.

The semiconductor chip CHP according to the second embodiment will be described with reference to FIGS. 18A, 18B, and 19. The upper surface diagram of the semiconductor chip CHP is the same as that of the semiconductor chip CHP shown in FIG. 2, and therefore the explanation of the semiconductor chip CHP is omitted. FIG. 18A shows a cross section A-A relating to the semiconductor device of second embodiment, and FIG. 18B shows a cross section B-B. Compared to first embodiment, the difference is that not only the cross-section B-B in which the emitter region NE is not formed but also the cross-section A-A in which the emitter region NE is formed has the conductive film CF1 (bottom electrodes BE) and the in-trench insulating film GF2 formed inside the trench T1. As shown in FIG. 18A, in the A-A cross section, a bottom electrode BE is formed between the gate electrode G1 and the end portion of the trench T1 on the lower surface Sb side. FIG. 19 is a C-C cross-sectional view of semiconductor device according to second embodiment. Since the conductive film CF1 (bottom electrode BE) and the in-trench insulating film GF2 are also formed in the A-A cross section, the bottom electrode BE exists in any area of the trench T1.

The manufacturing process of the present embodiment semiconductor chip CHP is the same as that of the first embodiment semiconductor chip CHP except for the process of FIG. 8A. In the first embodiment, in the step of FIG. 8A, the conductive film CF1 in the trench T1 of the A-A cross section was entirely removed by the dry etching method. In present embodiment, not all of the conductive film CF1 is removed, and a part of the conductive film CF1 in the trench T1 is removed as in the step of FIG. 9B. At this time, the remaining conductive film CF1 becomes the bottom electrodes BEs. Thereafter, as in the steps of FIGS. 10B and 11B, the gate insulating film GF1 and the in-trench insulating film GF2 are formed, and as in the step of FIG. 12B, the conductive film CF2 (gate electrodes G1) is formed. The rest of the manufacturing process is the same as that of the first embodiment, and therefore the explanation thereof is omitted.

For gate electrodes with trench structures (second embodiment effects), it is difficult to secure the withstand voltage because the electric field is concentrated at the end of the trench. In present embodiment, by forming the bottom electrode BE in all regions in the trench T1, the voltage applied to the gate electrode G1 can be relaxed and the breakdown voltage can be secured.

Third Embodiment

The semiconductor chip CHP according to the third embodiment will be described with reference to FIGS. 20 and 21. Present embodiment differs from second embodiment in that an emitter potential is applied to the bottom electrode BE.

Figure 20:
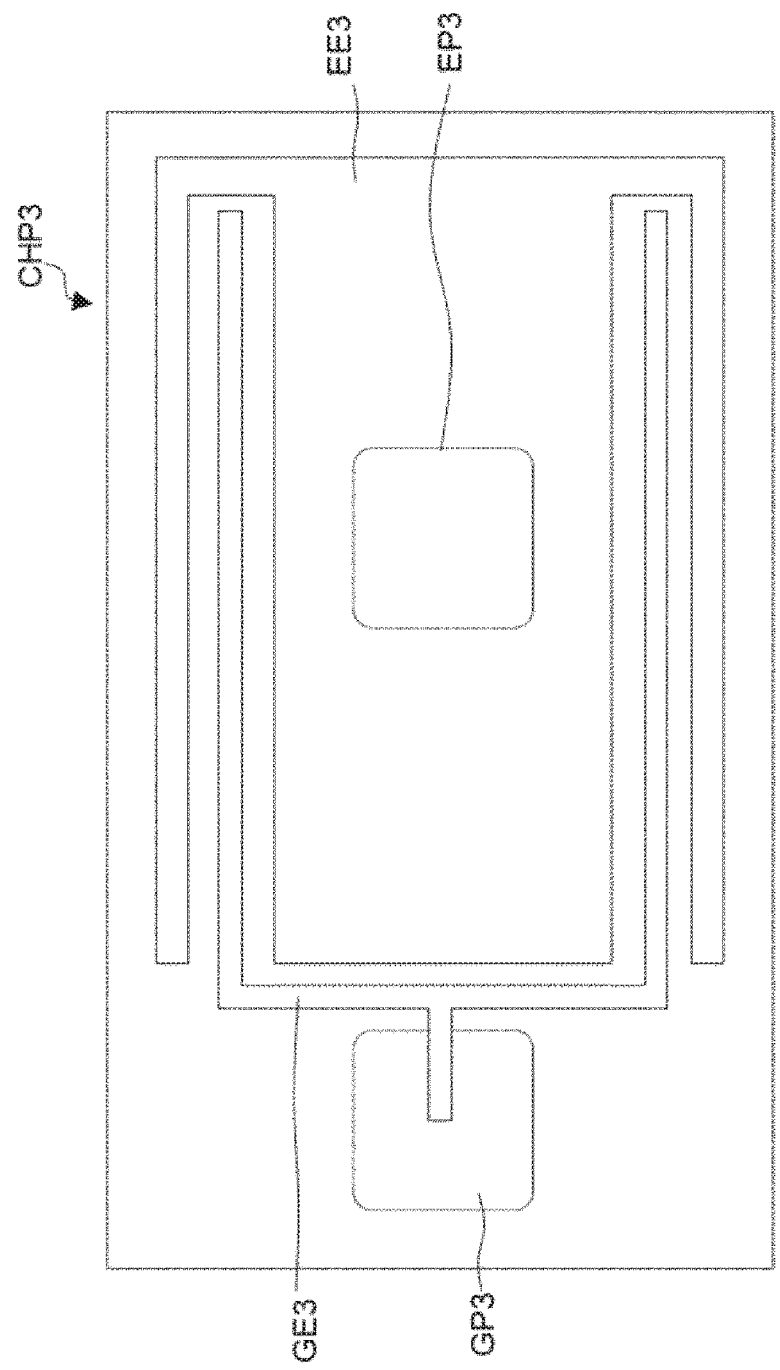
FIG. 20 is an entire plan view of the third embodiment chips.

FIG. 20 is an overall plan view of the semiconductor chip CHP3 of the present embodiment. Configurations of the A-A cross-sectional view, the B-B cross-sectional view, and the C-C cross-sectional view are the same as those of the second embodiment except that the emitter potential is applied to the bottom electrode BE, and therefore descriptions thereof are omitted. As shown in FIG. 20, the central part of the semiconductor chip CHP3 is covered with emitter potential electrodes EE3. A gate potential electrode GE3 is formed on the outer periphery of the emitter potential electrode EE3 so as to sandwich the emitter potential electrode EE3 therebetween. Further, on the outer periphery of the gate potential electrode GE3, the emitter potential electrode EE3 is formed so as to sandwich the gate potential electrode GE3 therebetween. The emitter potential electrode EE3 formed in the central portion of the semiconductor chip CHP and the emitter potential electrode EE3 formed so as to sandwich the gate potential electrode GE3 therebetween are connected at the outer peripheral portion of the semiconductor chip CHP. The gate potential electrode GE3 is connected to the gate electrode G1 in the semiconductor substrate SB, and the emitter potential electrode EE3 is connected to the bottom electrode BE in the semiconductor substrate SB.

A region surrounded by a broken line in the vicinity of the center portion of the emitter potential electrode EE3 is an emitter pad EP3, and a region surrounded by a broken line of the gate potential electrode GE3 is a gate pad GP3. The upper surface of the semiconductor chip CHP3 is covered with a protective film PIQ (not shown in FIG. 20), but the protective film PIQ is removed in the upper surface of the emitter pad EP3 and the gate pad GP3. External connection terminals such as wire bonds or clips are connected to the emitter pad EP3 and the gate pad GP3, and the semiconductor chip CHP3 is electrically connected to another chip or a circuit board through the external connection terminals.

FIGS. 21A to 21C are a simulation result obtained by calculating the hole concentration distribution when the length of the gate electrode G1 is changed. The sample A, the sample B, and the sample C are shown in order from the shorter length of the gate electrode G1, and the hole concentration distribution in each sample is shown. The hole concentration is expressed by the pitch width of the hatch, and the hole concentration is higher as the pitch width is narrower, and the hole concentration is lower as the pitch width is wider. As shown in FIGS. 21A to 21C, it can be seen that the shorter the length of gate electrode G1, the lower the hole density distribution contained in the semiconductor substrate. This is because holes are discharged to the emitter region NE by a parasitic P-type transistor (hereinafter referred to as a parasitic PMOS) configured with the floating region PF as a source, the hole barrier region NHB or the drift region ND as a channel-forming region, and the body region PR as a drain. Since the bottom electrode BE to which the emitter potential is applied functions as the gate of the parasitic PMOS, it is understood that the hole density distributions are lower in the sample in which the length of the bottom electrode BE is longer, that is, the length of the gate electrode G1 is shorter.

When the third embodiment (effects) turns off, the hole concentration distribution of the floating region PF can be reduced, so that the potential variation of the floating region PF can be suppressed, and the switching speed can be accelerated. In addition, since the holes are quickly discharged, the tail current at the time of turn-off can be reduced.

Fourth Embodiment

The CHP4 of the semiconductor chip according to fourth embodiment will be described with reference to FIGS. 22 to 24. Present embodiment differs from second embodiment in that a second gate potential is applied to the bottom electrode BE.

FIG. 22 is an overall plan view of the semiconductor chip CHP4 of the present embodiment. Configurations of the A-A cross-sectional view, the B-B cross-sectional view, and the C-C cross-sectional view are the same as those of the second embodiment except that the second gate potential is applied to the bottom electrode BE, and therefore descriptions thereof are omitted. As shown in FIG. 22, the central part of the semiconductor chip CHP4 is covered with emitter potential electrodes EE4. A gate potential electrode GE4 is formed on the outer periphery of the emitter potential electrode EE4 so as to sandwich the emitter potential electrode EE4, and a second gate potential electrode GE5 is formed so as to sandwich the gate potential electrode GE4. For the sake of simplicity of explanation, in the explanation of the present Embodiment only, the potential applied to the gate potential electrode GE4 is referred to as a first gate potential, and the potential applied to the gate potential electrode GE5 is referred to as a second gate potential. The gate potential electrode GE4 is connected to the gate electrode G1 in the semiconductor substrate SB, and the gate potential electrode GE5 is connected to the bottom electrode BE in the semiconductor substrate SB. Therefore, the first gate potential is applied to the gate electrode G1, and the second gate potential is applied to the bottom electrode BE. The first gate potential and the second gate potential are independently controlled.

FIG. 23 is a timing chart in which the first gate potential and the second gate potential are applied. The upper part of FIG. 23 shows the temporal variation of the first gate potential, and the lower part of FIG. 23 shows the temporal variation of the second gate potential.

During the time TM0~TM1, low-level voltages are applied to both the first gate potential and the second gate potential. That is, the IGBT is turned off. Next, during time TM1~TM2, high-level voltages are applied to both the first gate potential and the second gate output, and the IGBT is turned on. During this period, holes are accumulated in the floating region PF, and the on-resistance of the IGBT is reduced. Next, during the time TM2~TM3, a high-level voltage is applied to the first gate potential following the time TM2, and a low-level voltage is applied to the second gate potential. In other words, the gate electrode G1 to which the first gate potential is applied continues to be applied with a potential at which the IGBT is turned on, and the bottom electrode BE to which the second gate potential is applied is switched to a potential at which the IGBT is turned off. At this time, the upper portion of the trench T1 having the gate electrode G1 has the IGBT turned on, and the lower portion of the trench T1 having the bottom electrode BE has the IGBT turned off. When the IGBT in the lower portion of the trench T1 is turned off, the channels of the parasitic PMOS are formed in the lower portion of the trench T1. By the operation of the parasitic PMOS, the hole distributing density of the floating regions P F can be lowered.

Next, at time TM3, the first gate potential is applied from the high level voltage to the low level voltage. That is, the IGBT is completely turned off. Since the hole distributing density of the floating region PF has been lowered by the parasitic PMOS during the time TM2~TM3, the holes accumulated in the floating region PF and the drifting region ND are quickly discharged. After the first gate potential becomes the low level voltage at the time TM3, both the first gate potential and the second gate potential are maintained at the low level voltage. Since the holes continue to be discharged after the time TM3, the tail current can be reduced.

When the fourth embodiment turns off, the hole efficiencies can be enhanced by lowering the second gate potential at a time earlier than the first gate potential. This makes it possible to reduce the tail current at the time of turn-off while keeping the on-resistance of the IGBT low while the IGBT is on.

Figure 24:
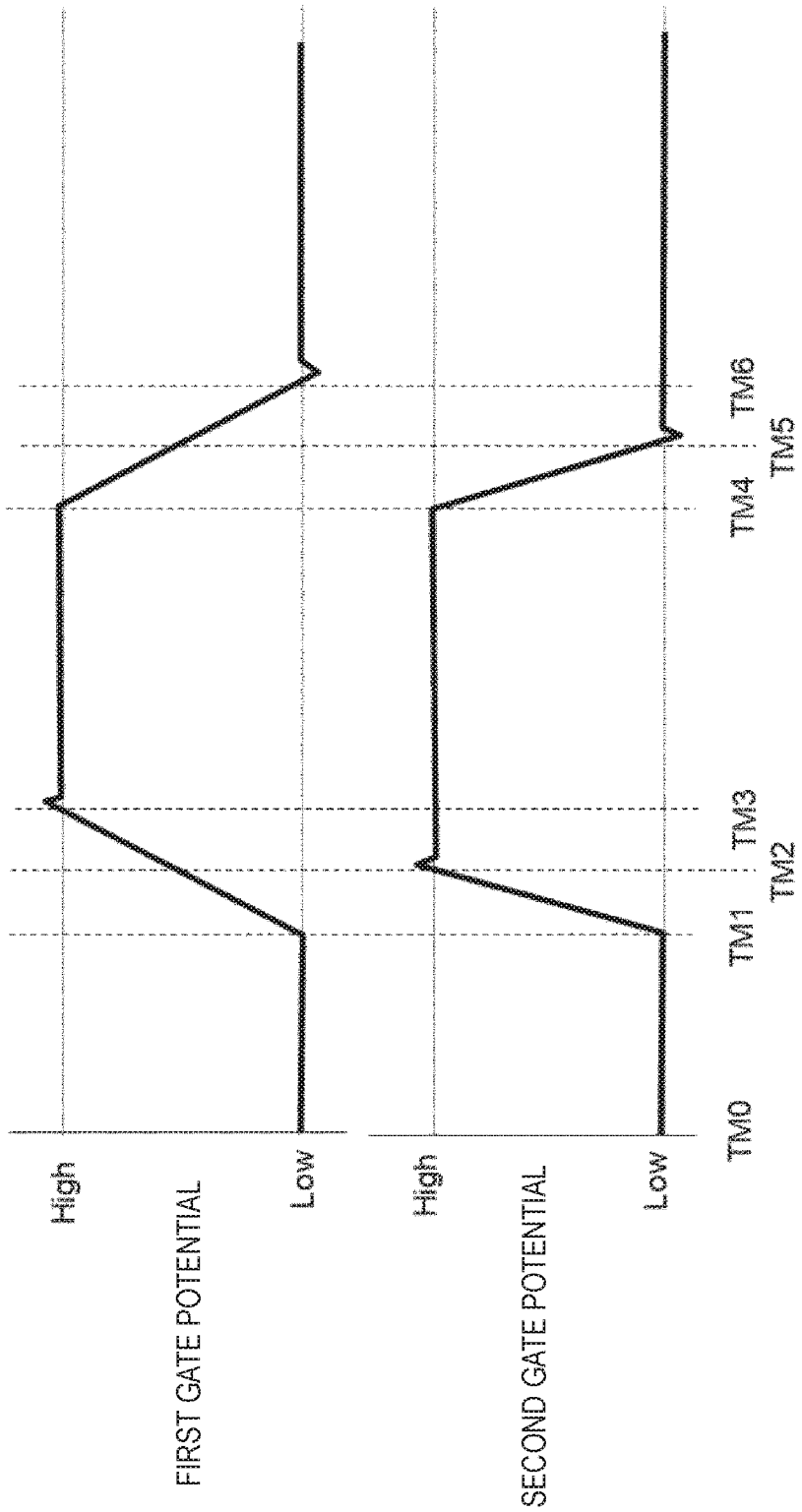
FIG. 24 is a timing chart showing a method of controlling the gate potential of the semiconductor chip of the modified example of the fourth embodiment.

FIG. 24 is an explanatory view of the modified example of the fourth embodiment, and shows a timing chart in which a first gate potential and a second gate potential are applied. In the fourth embodiment, the gate potential electrode GE4 and the second gate potential electrode GE5 are prepared in order to separately control the first gate potential and the second gate potential, but in the present modified example, the same effects as those of the fourth embodiment are realized only by the gate potential electrode GE4.

Both the first gate potential and the second gate potential are controlled by voltages applied from the gate potential electrodes GE4. However, in the present modified example, the gate electrodes G1 and the bottom electrodes BE have different gate resistances. When different gate resistors are provided, the voltage changes from a low level to a high level or from a high level to a low level, and therefore, the difference is used to realize the same effects as those of the fourth embodiment. Different gate-resistance values may be provided by connecting a resistor to the outside of the semiconductor device or adding a resistor to the inside of the semiconductor device. As a way of adding a resistor to the inside of the semiconductor device, the phosphorus concentration of the conductive film CF1 constituting the bottom electrode BE is made higher than the phosphorus concentration of the conductive film CF2 constituting the gate electrode G1. Alternatively, a resistor made of polysilicon or the like is formed inside the semiconductor chip CHP so that the resistance of the bottom electrode BE is smaller than that of the gate electrode G1.

Next, the operation of the fourth embodiment will be described with reference to FIG. 24. The present modified example differs from fourth embodiment in the timings and speeds of rising and falling of the first gate potential and the second gate potential.

During the time TM0~TM1, low-level voltages are applied to both the first gate potential and the second gate potential. That is, the IGBT is turned off. Next, although a high-level voltage is applied to both the first gate potential and the second gate potential at the time TM1, the first gate potential rises more slowly than the second gate potential due to a difference in resistivity. After the time TM3 at which both of the first gate potential and the second gate potential completely rise, a high-level voltage is applied to both of them, and the IGBT is turned on.

Next, at time TM4, although a low-level voltage is applied to both the first gate potential and the second gate potential, the first gate potential falls more slowly than the second gate potential due to a difference in resistivity. Therefore, the second gate potential is switched to the low level voltage earlier than the first gate potential. During the period from the time TM5 at which the second gate potential completely falls to the time TM6 at which the first gate potential completely falls, similarly to the period of the time TM2~TM3 in FIG. 23, the IGBT in the lower portion of the trench T1 is turned off, and the channel of the parasitic PMOS is half formed. Since the following operations and effects are the same as those of the fourth embodiment, their descriptions are omitted.

(Effects of Fourth Embodiment Modified Example)

Control of the two potentials of the first gate potential and the second gate potential can be achieved with only one of the gate potential electrode GE4. Therefore, there is no need to prepare two gate potentials as in fourth embodiment.

Fifth Embodiment

Figure 25:
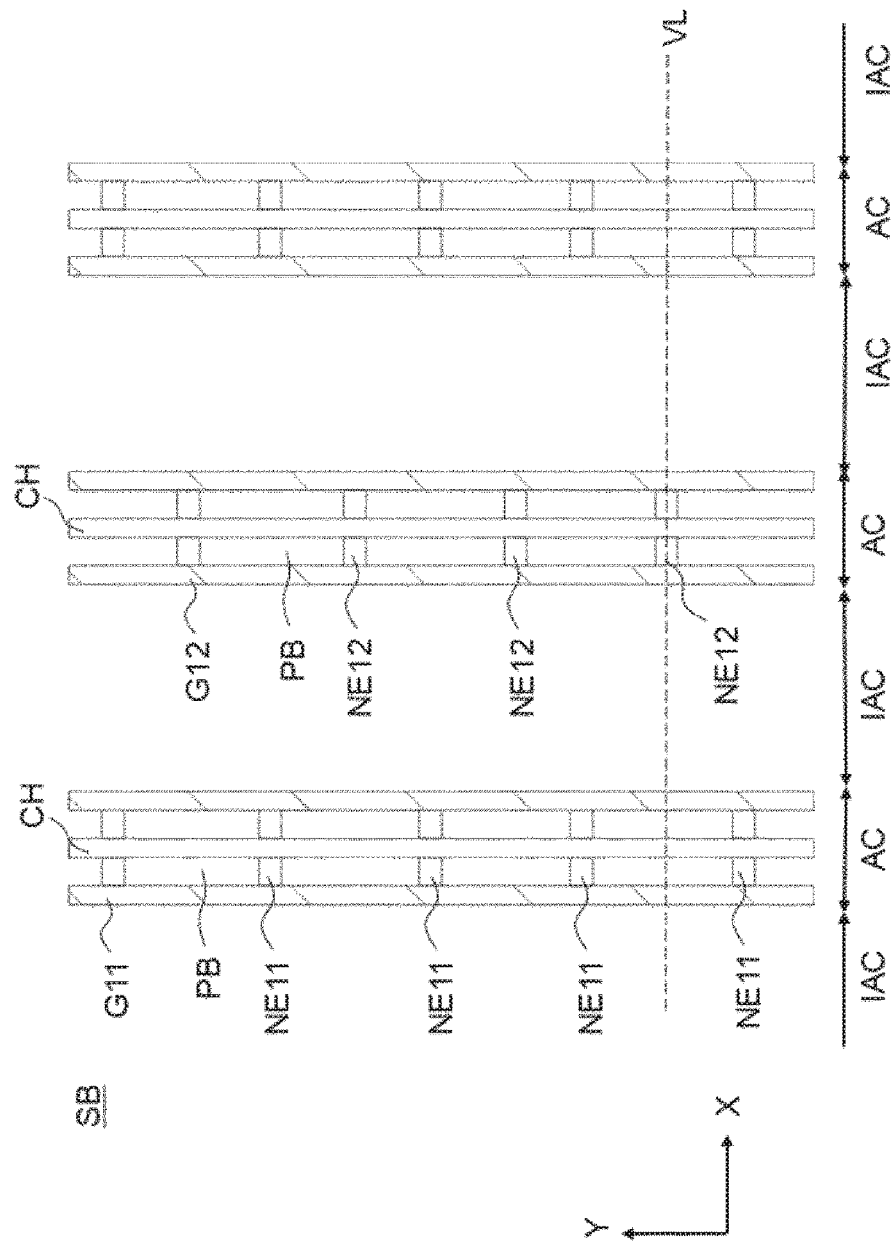
FIG. 25 is a plan view of the main portion of fifth embodiment chips.

FIG. 25 is a plan view of the main portion of the semiconductor chip according to the fifth embodiment. Present embodiment differs from first embodiment in the layout in which the emitter regions NEs are formed when the main surface of the semiconductor chip CHP is viewed in a plane.

As shown in FIG. 25, a GG-structured type IGBT is described as an example. A plurality of gate electrodes G11 and G12 are formed on the semiconductor chip. A plurality of emitter regions NE11 and NE12 are arranged on the sides of the plurality of gate electrodes G11 and G12, respectively. Like the gate electrode G1, the depth of the gate electrode G11 (G12) located on the side of the emitter region NE11 (NE12) is deeper than the depth of the gate electrode G11 (G12) located on the side of the region between the emitter regions NE11(NE12). At this time, each of the plurality of emitter regions NE12 is formed on a region sandwiched between two adjacent emitter regions NE11 in a direction perpendicular to the direction in which the gate electrode G11 (G12) extends (that is, the X direction). In other words, the emitter region NE11 and the emitter region 12 are arranged so as not to overlap each other in the X-direction. In addition, the emitter region 12 can be said to be located on an imaginary line VL that passes through a region located between the plurality of adjacent emitter regions in the Y direction and extends along the X direction perpendicular to the Y direction. By arranging in this manner, holes accumulated in the floating region PF adjoining the region RG1 in which the emitter region NE is formed in the active cell region AC can be efficiently discharged by utilizing the parasitic PMOS. This is because the region RBE in which the bottom electrodes BE are formed in the trenches T1 is more effective in discharging holes than the region RG1.

Note that present embodiment is applicable to the planar configuration of the semiconductor chip CHP from first embodiment to fourth embodiment.

Although the invention made by the inventor of the present application has been specifically described based on the embodiment, the present invention is not limited to the above embodiment, and various modifications can be made without departing from the gist thereof.

What is claimed is:

1. A semiconductor device comprising;
a semiconductor substrate having a first main surface and a second main surface opposite to the first main surface;
a first semiconductor region of a first conductivity type provided in the semiconductor substrate;
a second semiconductor region of a second conductivity type opposite to the first conductivity type provided in the semiconductor substrate between the first semiconductor region and the first main surface;
a first trench formed in a stripe shape in a first direction along the first main surface in plan view and formed in a second direction form the first main surface to the second main surface;
a first gate electrode provided in the first trench via a first insulation film;
a plurality of third semiconductor regions of the first conductivity type provided on the first main surface at predetermined intervals along the first direction, and in contacts with a side surface of the first trench in plan view; and,
a fourth semiconductor region of the second conductivity type provided on the second main surface;
wherein the first gate electrode includes in plan view;
a first portion adjacent to each of the plurality of third semiconductor regions; and a second portion adjacent to a region between the plurality of third semiconductor regions on the first main surface;
wherein a length of the second portion of the first gate electrode is less than a length of the first portion of the first gate electrode in the second direction.

2. The semiconductor device according to claim 1,
wherein the length of the first portion of the first gate electrode is a thickness of the first gate electrode in a portion where the first portion of the first gate electrode is formed deepest in the second direction,
wherein the length of the second portion of the first gate electrode is a thickness of the second gate electrode in a portion where the second portion of the first gate electrode is formed deepest in the second direction, and
wherein the thickness is a shortest distance between the first main surface and the portion formed deepest in the second direction.

3. The semiconductor device according to claim 1,
wherein a side surface of the second portion of the first gate electrode is not formed the third semiconductor region.

4. The semiconductor device according to claim 1, further comprising:
a second trench formed in a strip shape along the first direction in plan view and formed along the second direction; and,
a second gate electrode provided in the second trench via an insulating film,
wherein the second gate electrode comprising:
a third portion adjacent to each of the plurality of third semiconductor regions in plan view; and
a fourth portion adjacent to a region of the first main surface positioned between the plurality of third semiconductor regions,
wherein the fourth portion of the second gate electrode has a length shorter than the third portion of the second gate electrode in the second direction.

5. The semiconductor device according to claim 4, further comprising:
a fifth semiconductor region of the second conductivity type;
wherein the fifth semiconductor region is formed on the first main surface,
wherein the fifth semiconductor region is formed in a region sandwiched between the first gate electrode and the second gate electrode, and
wherein the fifth semiconductor region is formed in a region not including the third semiconductor region.

6. The semiconductor device according to claim 1, further comprising:
a bottom electrode in the first trench which differing from the first gate electrode,
wherein the bottom electrode is formed between the first portion of the first gate electrode and an end portion of the first trench on a side of the second main surface in the second direction.

7. The semiconductor device according to claim 6,
wherein the bottom electrode is formed between the second portion of the first gate electrode and an end portion of the first trench on a side of the second main surface.

8. The semiconductor device according to claim 7,
wherein an emitter potential is applied to the bottom electrode.

9. The semiconductor device according to claim 8,
wherein a first gate potential is applied to the first gate electrode, and a second gate potential controlled independently of the first gate potential is applied to the bottom electrode.

10. The semiconductor device according to claim 9,
wherein the first semiconductor region, the first gate electrode, the bottom electrode, and the fourth semiconductor region constitute a transistor,
wherein the transistor is turned on when the first gate potential and the second gate potential are at a high level, and is turned off when the first gate potential and the second gate potential are at a low level, and
wherein the second gate potential is changed from a high level to a low level earlier than a time when a change of the first gate potential from a high level to a low level is completed.

11. The semiconductor device according to claim 1, further comprising:
a third trench formed in a stripe shape along the first direction and formed along the second direction in plan view,
a third gate electrode provided in the third trench via an insulating film, and
a plurality of sixth semiconductor regions of the first conductivity type formed on the first main surface at predetermined intervals along the first direction and in contact with the side surface of the third trench,
wherein the third gate electrode comprising:
a fifth portion adjacent to each of the plurality of sixth semiconductor regions in plan view, and
a sixth portion adjacent to a region of the first main surface positioned between the plurality of sixth semiconductor regions,
wherein the sixth portion has a length shorter than the fifth portion in the second direction, and
wherein the sixth semiconductor region passes through a region of the first main surface positioned between the plurality of third semiconductor regions in plan view and located on an imaginary line extending along a third direction perpendicular to the first direction.

12. A semiconductor device comprising:
a semiconductor substrate having a first main surface and a second main surface opposite to the first main surface;
a first semiconductor region of a first conductivity type provided in the semiconductor substrate;
a second semiconductor region of a second conductivity type opposite to the first conductivity type provided in the semiconductor substrate between the first semiconductor region and the first main surface; and
a third semiconductor region of the second conductivity type provided in the second main surface;
wherein the semiconductor substrate has a first region and a second region different from the first region in plan view,
wherein the first region comprising:
a first trench formed in a first direction along the first main surface of the semiconductor substrate in plan view, and formed in a second direction from the first main surface to the second main surface of the semiconductor substrate in plan view;
a first gate electrode via an insulating film in the first trench and having a first depth; and
a fourth semiconductor region of the first conductivity type formed in contact with the first main surface and the first trench in plan view, and
wherein the second region comprising:
a second trench formed in the first direction and the second direction; and,
a second gate electrode via an insulating film in the second trench and having a second depth;
wherein the first depth of the first gate electrode is deeper than the second depth of the second gate electrode.

13. The semiconductor device according to claim 12,
wherein the first trench and the second trench are the same trench, and
wherein the first gate electrode and the second gate electrode are formed in the same trench.

14. The semiconductor device according to claim 12,
wherein a plurality of the first regions and a plurality of the second regions arrange respectively, and the plurality of the first regions and the plurality of the second regions are alternately arranged along the first directions.

15. The semiconductor device according to claim 12,
wherein the first depth of the first gate electrode is a thickness of the first gate electrode in a portion where the first portion of the first gate electrode is formed deepest in the second direction,
wherein the second depth of the second gate electrode is a thickness of the second gate electrode in a portion where the second portion of the first gate electrode is formed deepest in the second direction, and
wherein the thickness is a shortest distance between the first main surface and the portion formed deepest.

16. The semiconductor device according to claim 12, further comprising a bottom electrode;
wherein the bottom electrode is formed in the second direction between the first gate electrode and an end portion of the first trench on a side of the second main surface and between the second gate electrode and an end portion of the second trench on a side of the second main surface.

17. The semiconductor device according to claim 16,
wherein emitter potentials are applied to the bottom electrode.

18. A manufacturing method of a semiconductor device, comprising the step of:
(a) providing a semiconductor substrate of a first conductivity type having a first main surface and a second main surface opposite to the first main surface, and forming a first semiconductor region of a second conductivity type opposite to the first conductivity type on the first main surface of the semiconductor substrate;
(b) forming a first trench provided on the first main surface along the first main surface in plan view and provided along a second direction from the first main surface to the second main surface;
(c) forming a first gate electrode having a first length in the second direction in a first region of the region where the first trench is formed;
(e) forming a second gate electrode having a second length in the second direction in a second region different from the first region in the region where the first trench is formed;
(f) forming a second semiconductor region of the first conductivity type in a region where the first main surface contacts the first region; and
(g) forming a third semiconductor region of the second conductivity type in the second main surface;

wherein a first length of the first gate electrode has longer than a second length of the second gate electrode.

19. The method of manufacturing a semiconductor device according to claim 18, further comprising:
(h) before the step of (e), forming a first bottom electrode in the second region
wherein the first bottom electrode is formed between the first gate electrode and an end portion of the first trench on a side of the second main surface in the second direction.

20. The method of the manufacturing a semiconductor device according to claim 19, further comprising:
(i) before the step of (c), forming a second bottom electrode in the first region,
wherein the second bottom electrode is formed between the first gate electrode and an end portion of the first trench on the side of the second main surface in the second direction, and
wherein emitter potentials are applied to the first bottom electrode and the second bottom electrode.

* * * * *